United States Patent [19]

Walstrom

[11] Patent Number: 5,757,009
[45] Date of Patent: May 26, 1998

[54] CHARGED PARTICLE BEAM EXPANDER

[75] Inventor: Peter L. Walstrom, Los Alamos, N. Mex.

[73] Assignee: Northrop Grumman Corporation, Los Angeles, Calif.

[21] Appl. No.: 773,702

[22] Filed: Dec. 27, 1996

[51] Int. Cl.⁶ .................................................. H01J 37/141
[52] U.S. Cl. .......................... 250/396 R; 250/396 ML; 250/398
[58] Field of Search ................ 250/396 R, 396 ML, 250/492.2, 492.21, 492.3, 398; 313/361.1

[56] References Cited

U.S. PATENT DOCUMENTS

| | | | |
|---|---|---|---|
| 3,845,312 | 10/1974 | Allison, Jr. | 250/492.21 |
| 3,956,634 | 5/1976 | Tran et al. | 250/396 R |
| 4,736,106 | 4/1988 | Kashy et al. | 250/396 R |
| 4,767,930 | 8/1988 | Stieber et al. | 250/396 ML |
| 4,962,317 | 10/1990 | Jason et al. | 250/396 ML |
| 5,468,965 | 11/1995 | Garnett et al. | 250/396 ML |

*Primary Examiner*—Kiet T. Nguyen
*Attorney, Agent, or Firm*—Terry J. Anderson; Karl J. Hoch, Jr.

[57] ABSTRACT

A charged particle beam expander increases a diameter of a charged particle beam while increasing uniformity of an area energy distribution thereof. The charged particle beam expander has a first linear optics section receiving the charged particle beam from a particle accelerator and for forming the charged particle beam to have a generally circular cross-section and a non-linear optics section receiving the charged particle beam from the first linear optics section and for redistributing charged particles from a periphery of the charged particle beam toward a core thereof. The charged particle beam expander also has a second linear optics section receiving the charged particle beam from the non-linear optics section, the second linear optics section for increasing the diameter of the charged particle beam and for imaging the charged particle beam onto the target.

18 Claims, 28 Drawing Sheets

CHARGED PARTICLE BEAM EXPANDER

FIELD OF THE INVENTION

The present invention relates generally to charged particle beam accelerator optics and more particularly to a charged particle beam expander for expanding a generally circular charged particle beam having a generally Gaussian energy distribution with substantial energy density at the fringes thereof into a larger generally circular beam having a substantially uniform energy density.

BACKGROUND OF THE INVENTION

Various particle accelerators, e.g., linear accelerators, cyclotrons, etc., are commonly utilized to generate charged particle beams. Such charged particle beams comprise charged particles, e.g., protons, electrons, etc., which have been accelerated to high energies for use in a variety of different applications such as accelerator-boosted subcritical power reactors (e.g., thorium-burning reactors), electron-beam processing of materials, food sterilization, ion-beam micro machining, lithography, medical therapies, neutron spallation, pulsed or steady state neutron sources for research, transmutation of nuclear waste, surface implantation of ions into a silicon wafer for semiconductor fabrication, tritium production, x-ray generation, as well as a variety of other charged particle applications.

In many such applications, the target area is substantially larger than the charged particle beam produced by the particle accelerator. Thus, it is necessary to expand the charged particle beam, so as to increase the surface area of the target illuminated thereby. Furthermore, it is frequently necessary to expand small diameter, high power-density, charged particle beams generated by a particle accelerator, prior to their being incident upon a target, thus producing an expanded beam with a substantially flat and well-confined intensity distribution, so as to avoid excessive local heating of the target.

Further, when the target is circular or nearly circular in cross-section, it is frequently desirable to maintain the generally circular cross-section of the charged particle beam, so as to avoid loss of beam energy outside of the target area, and also so as to avoid undesirable radio-activation, radiation damage and/or excessive heating of beam line and other nearby components.

According to contemporary methodology for utilization in the production of tritium, for example, a high energy particle accelerator generates a proton beam of approximately 100 mA at 2 GeV, providing approximately 200 megawatts of continuous power. This proton beam is incident upon a heavy-metal target, so as to effect the generation of neutrons which are incident upon certain isotopes of lithium or helium ($Li^6$ or $He^3$) so as to produce tritium therefrom.

The charged particle beam generated by a high energy particle accelerator typically has a diameter of only a few millimeters. The target typically has a surface area of approximately 1 $m^2$.

Thus, the charged particle beam of the particle accelerator must either be expanded so as to cover substantially the entire surface of the target, or alternatively, may be rastered so as to sweep across various different portions of the target sequentially. However, in many applications, the peak transient local heating from an unexpanded rastered beam is unacceptably large. Further, the control circuitry and power supplies required to provide the excitation for such rastering magnets can be undesirably complex and expensive.

As such, it is frequently more desirable to effect expansion of the charged particle beam for use in such applications, as opposed to utilizing the rastering process.

As those skilled in the art will appreciate, the charged particle beam generated by a particle accelerator generally comprises a Gaussian energy distribution having substantial energy in the fringes or outermost periphery thereof. Thus, the energy distribution of such a charged particle beam is undesirably non-uniform. It is desirable to provide an expanded particle beam having a nearly uniform charge distribution, so as to avoid localized heating, and also so as to confine the expanded beam to a well-defined area, with essentially no particle flux outside of the area.

For example, in a food sterilization application, it is desirable to irradiate such food with a charged particle beam having an intensity within a well defined range. By maintaining the beam density within fairly uniform parameters, it is much easier to assure that the irradiated food has received the desired dose of radiation. If the charged particle beam were excessively non-uniform, then it may be possible to under irradiate some portion of the food being processed thereby at a given accelerator output, while overirradiating other portions of the food being processed thereby at an increased accelerator output. Thus, no accelerator output would be suitable for irradiating all of the food processed therewith completely within the desired range because of such beam non-uniformities.

Further, a substantial percentage of the total charged particle beam energy may be contained within the fringes of the unexpanded beam. This energy may not be available to the target if the target is substantially smaller than the expanded charged particle beam or if the charged particle beam is to be incident upon the target edges and thus overlaps the target. Energy contained within the beam fringes would therefore be wasted. Moreover, in many applications, substantial irradiation of objects and equipment outside of the target are is unacceptable.

Two exemplary devices for facilitating the expansion of charged particle beams are disclosed in U.S. Pat. No. 4,962,317 issued on Oct. 9, 1990 to Jason et al. and entitled CONFINED ENERGY DISTRIBUTION FOR CHARGED PARTICLE BEAMS, and U.S. Pat. No. 5,468,965 issued on Nov. 21, 1995 to Garnett et al. and entitled CIRCULAR, CONFINED DISTRIBUTION FOR CHARGED PARTICLE BEAMS. However, although such devices have proven generally useful for their intended purposes, each suffers from inherent deficiencies which detract from its overall utility in many applications.

More particularly, although the Jason et al. device does redistribute the energy found in the fringes of the charged particle beam, it results in the formation of a rectangular charged particle beam, which in some applications is undesirable. Moreover, although in principle the non-linear elements (e.g., octupoles) in the Jason et al. device can be conventional multipole magnets, with high-energy beams (e.g., in tritium production) they must be special magnets in order that they may have the needed field strength.

Also, although the Garnett et al. device does result in a generally circular expanded charged particle beam, the distribution is substantially peaked in the center. Moreover, since the Garnett et al. device is essentially the Jason et al. device with skew quadrupoles added at the end, it contains the same nonconventional non-linear magnets as the Jason et al. device.

In view of the foregoing, it is desirable to provide a device for generating a well-confined charged particle beam which is generally circular in cross-sectional area and within which the energy is substantially uniformly distributed thereacross, with essentially no particle flux outside of the periphery of the beam.

SUMMARY OF THE INVENTION

The present invention specifically addresses and alleviates the above-mentioned deficiencies associated with the prior art. More particularly, the present invention comprises a charged particle beam expander for increasing the diameter of a charged particle beam while also increasing the uniformity of the area energy distribution thereof and simultaneously confining the particles to a well-defined area. Thus the charged particle beam expander of the present invention redistributes charged particles from the fringes or periphery of the beam toward the core thereof, so as to provide a more uniform energy density through a circular cross-section of the circular beam.

The charged particle beam expander generally comprises a first linear optics section which receives the charged particle beam from a particle accelerator and which forms the charged particle beam so as to have a generally circular cross-section. Thus, if a non-circular, e.g., elliptical, etc., charged particle beam is provided from the particle accelerator, then the first linear optics section forms that non-circular beam into a beam having a generally circular cross-section.

Next, a non-linear optics section receives the charged particle beam from the first linear optics section and redistributes charged particles from the periphery of the charged particle beam toward the core thereof, thus providing a more uniform energy distribution through a cross-section of the generally circular charged particle beam. Some expansion of the beam may occur within the nonlinear optic section and/or between the non-linear optics section and the second linear optics section.

Next, a second linear optics section receives the charged particle beam from the non-linear optics section and images a charged particle beam of the desired diameter onto the target. Thus, the second linear optics section expands or reduces the diameter of the beam so as to be compatible with the target.

In this manner, a well-confined charged particle beam having the desired diameter, generally circular cross-sectional configuration, and uniform energy distribution is provided.

The first linear optics section preferably comprises at least four quadrupole magnets. The non-linear optics section preferably comprises at least one magnetic doublet. Each magnet doublet preferably comprises two magnetic multipole elements of opposite polarities, separated by a short drift or field-free region. The multipole elements of a doublet may be sextupoles, octupoles, or higher multipoles. The non-linear optics section may additionally comprise at least one drift, as well as at least one quadrupole magnet.

The fields of the sextupole and octupole magnets of each doublet have opposite polarities. The polarities of each sextupole and/or octupole magnet of a particular doublet are preferably approximately equal in intensity. However, the field of each sextupole and/or octupole magnet of a particular doublet may differ slightly in intensity so as to facilitate formation of a charged particle beam having a more nearly circular cross-sectional configuration. The effect of a sextupole, octupole, or higher multipole doublet comprising two sextupoles, two octupoles, etc., with the same pole rotation angle and of opposite signs, is that of imparting a nearly axisymmetric inward impulse that has a non-linear dependence on the radial distance from the magnet axis. A sextupole doublet of this type produces a net inward impulse that is proportional to the cube of the radial distance of the particle from the axis; an octupole doublet produces a net inward impulse that is proportional to the fifth power of the radial distance from the axis. In contrast, a quadrupole doublet with closely-spaced magnets of equal strength and opposite polarity produces an inward impulse that is linear with radius. Quadrupole elements alone therefore cannot be used for non-linear manipulation of particle beams, but can be used in combination with non-linear elements for non-linear beam shaping.

Although the first linear optics section, the non-linear optics section, and the second linear optics section preferably comprise magnetic elements, they may, especially in lower energy applications, alternatively comprise either electrostatic elements or a combination, i.e., hybrid, of magnetic and electrostatic elements.

The magnetic doublets of the non-linear optics section may be optionally configured so as to facilitate expansion of the charged particle beam within the non-linear section, thus reducing the required expansion provided by the second linear optics section.

Thus, according to the present invention, a charged particle beam expander is provided which expands a charged particle beam to a desired diameter while providing a generally circular cross-section thereof and also providing a substantially uniform cross-sectional particle flux density distribution that is confined within a circle of desired diameter. It should be noted that confinement of the beam is at least as important in some applications as having a uniform flux density. Linear systems are capable of expanding the beam, but suffer from the inherent deficiencies that as the beam is expanded thereby, the tails tend to grow to a very large diameter and thus tend to miss the target and irradiate other equipment.

DETAILED DESCRIPTION OF THE PREFERRED EMBODIMENTS

The detailed description set forth below in connection with the appended drawings is intended as description of the presently preferred embodiment of the invention and is not intended to represent the only form in which the present invention may be constructed or utilized. The description sets forth the functions and the sequence of steps for constructing and operating the invention in connection with the illustrated embodiment. It is to be understood, however, that the same or equivalent functions and sequences may be accomplished by different embodiments that are also intended to be encompassed within the spirit and scope of the invention.

Figure 1:
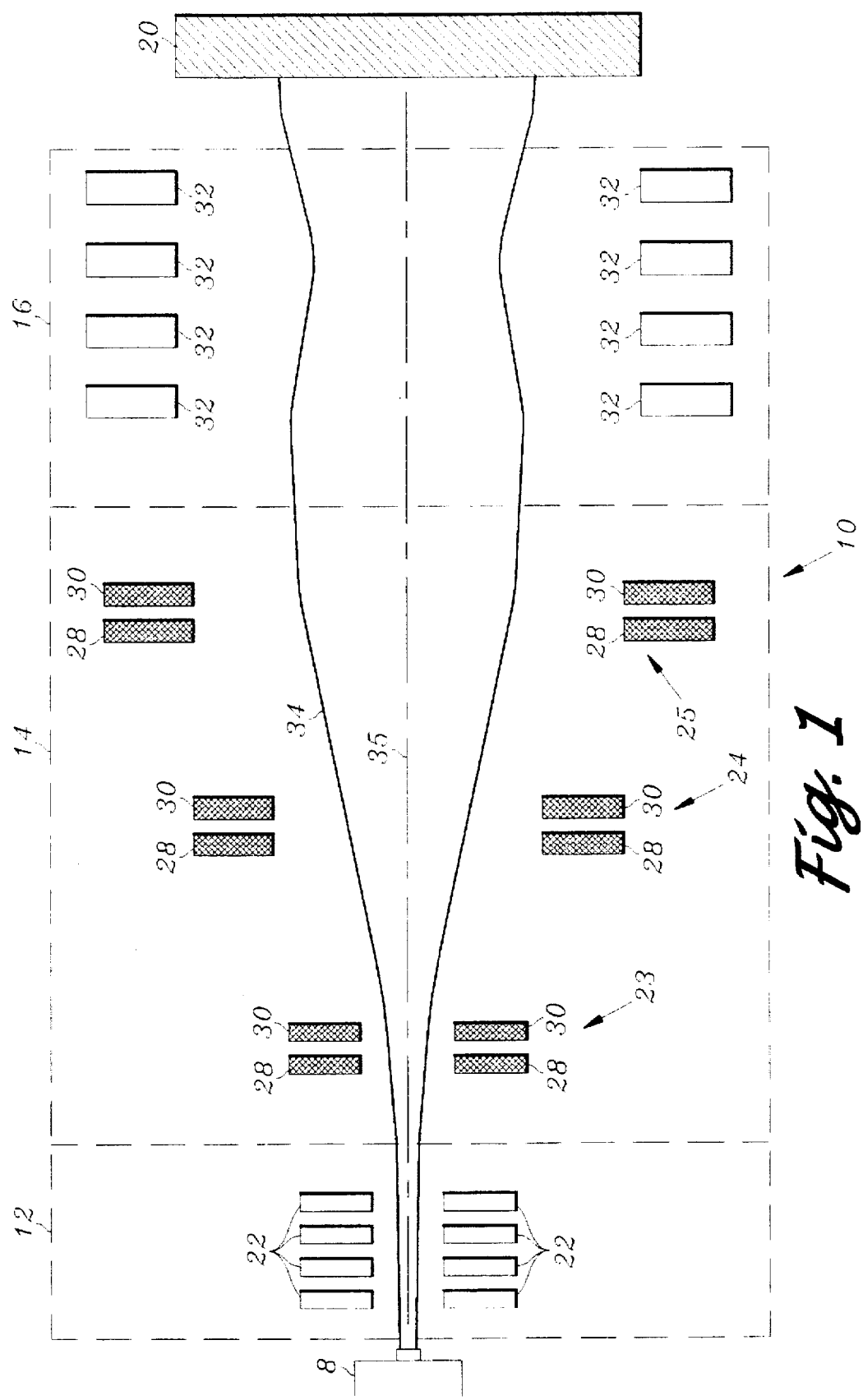
FIG. 1 is a schematic representation of the charged particle beam expander of the present invention showing the envelope of the beam as it travels from the accelerator to the target and passes thorough the first linear optics, non-linear optics, and second linear optics thereof.
Figure 2:
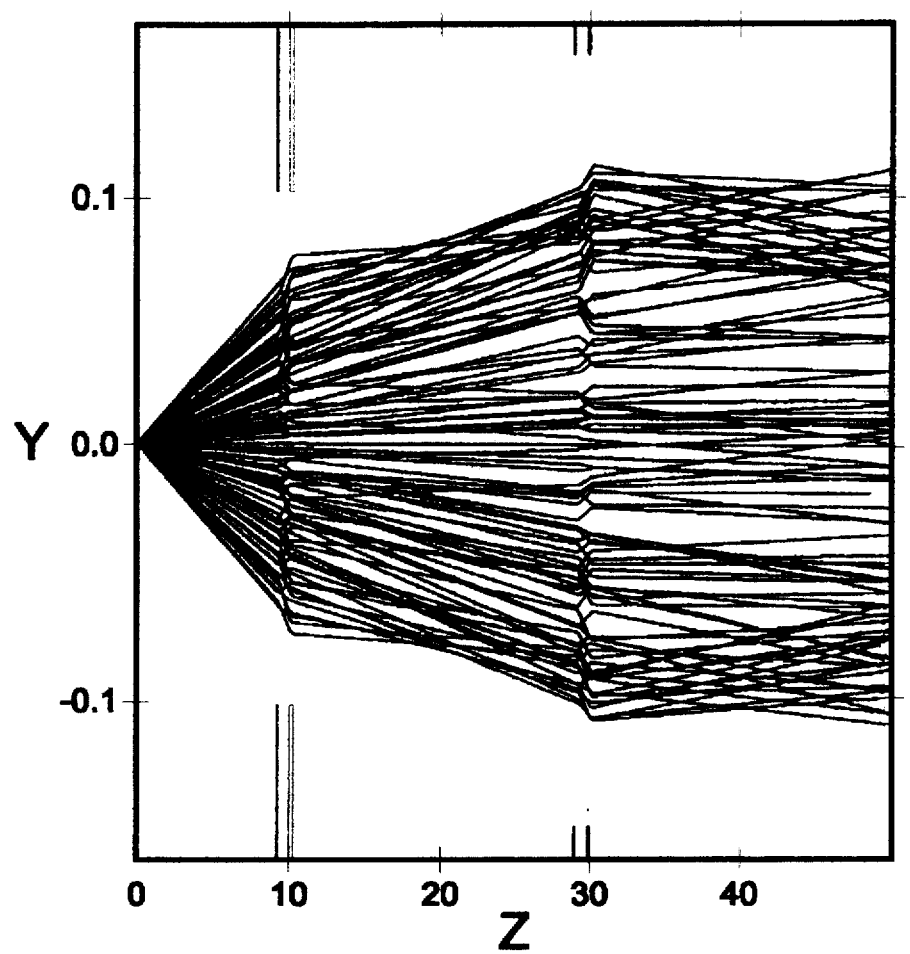
FIG. 2 is a plot showing the projection of the particle beam trajectories on the x-z plane for a non-linear optics section having two sextupole doublets, the input particle distribution is flat in x'-y' space; in this plot and subsequent plots, particle trajectories and final locations were calculated by treating the magnets as a series of thin-lens multipole magnets and drifts.
Figure 3:
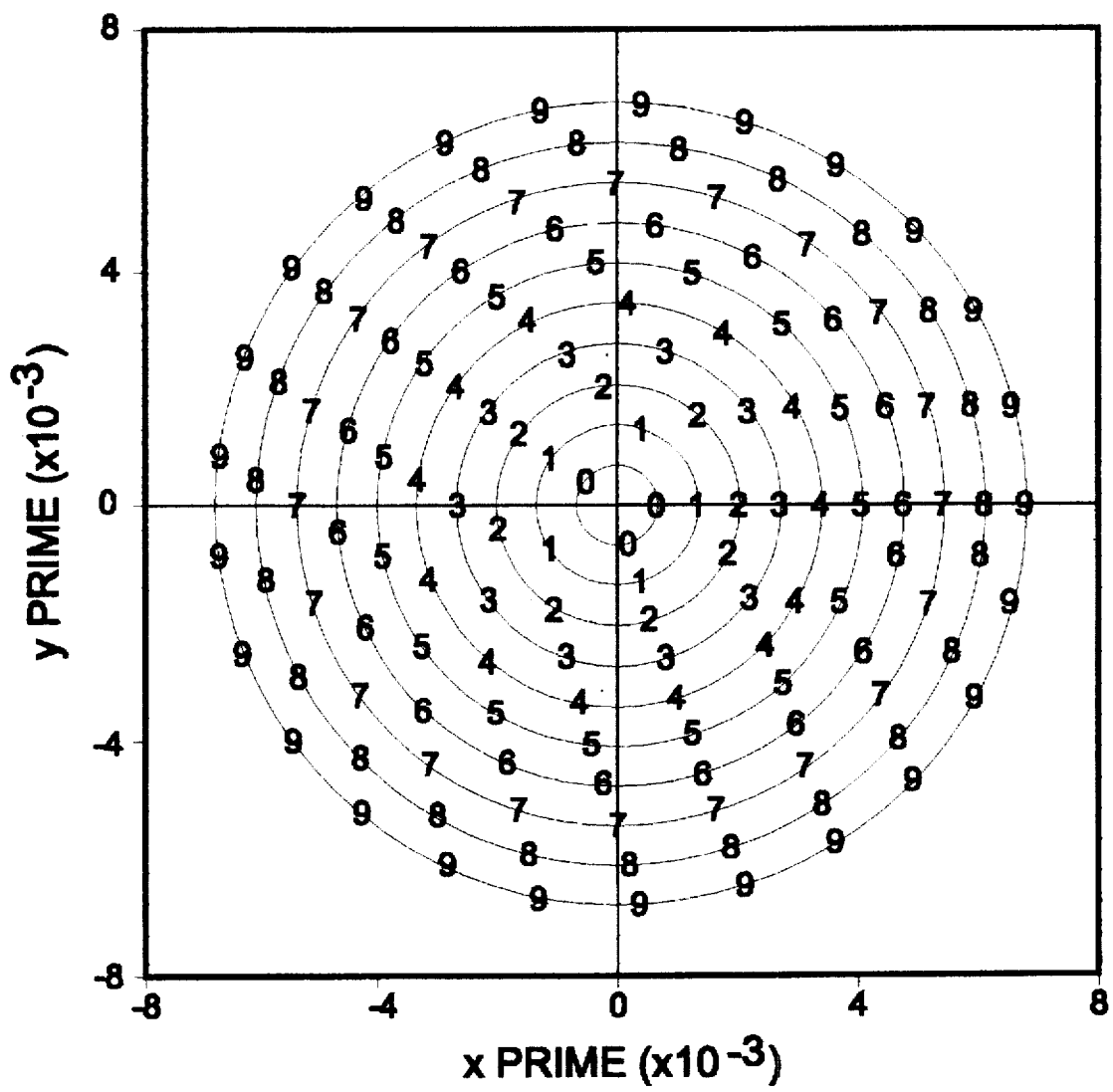
FIG. 3 is a plot of input beam circles, i.e., showing the initial angles x' and y' of particles emitted from an effective point source at the input.
Figure 4:
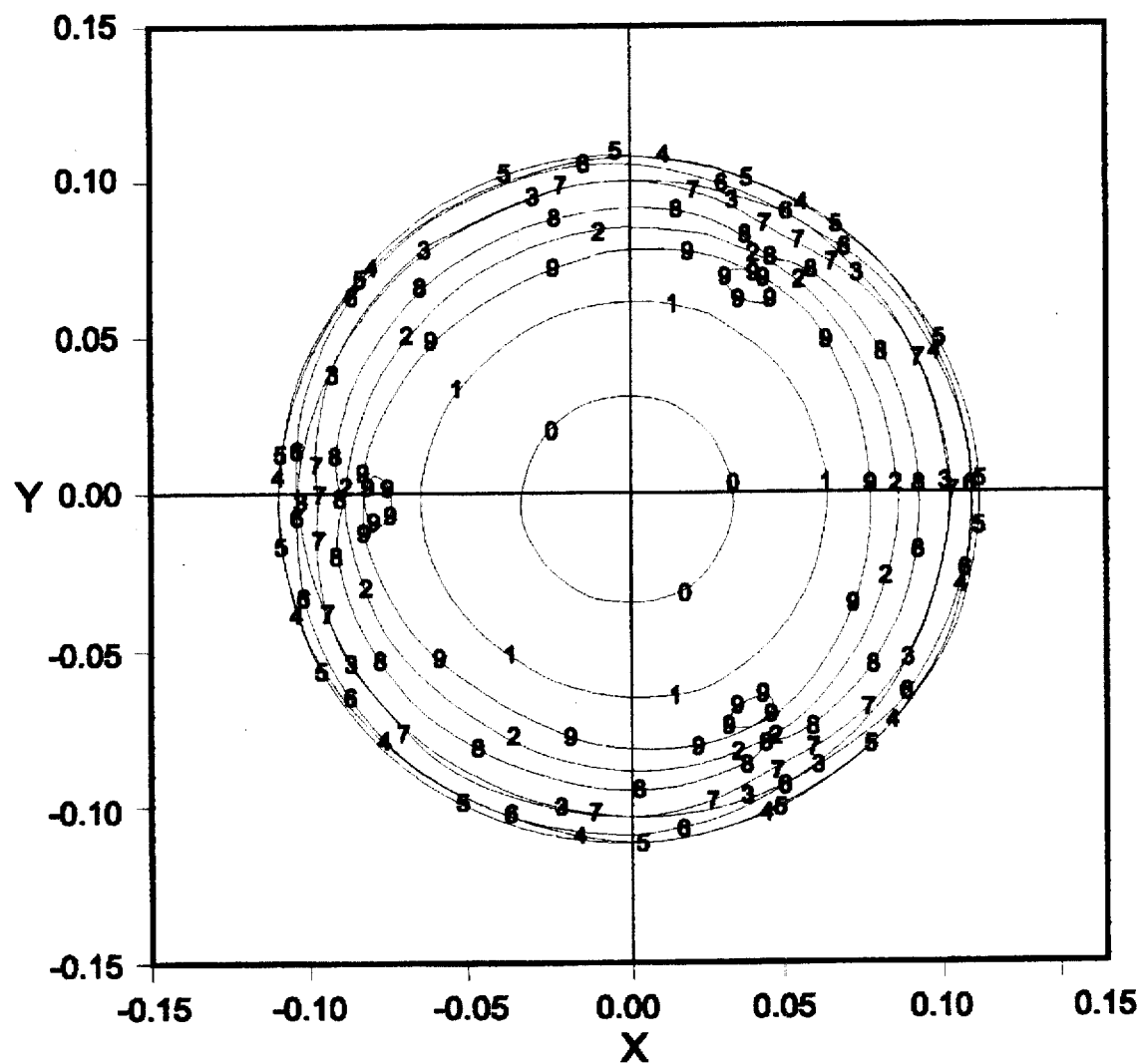
FIG. 4 is a plot of the images of the input circles of FIG. 3 in the x-y plane after being processed by a non-linear optics section having two sextupoles.
Figure 5:
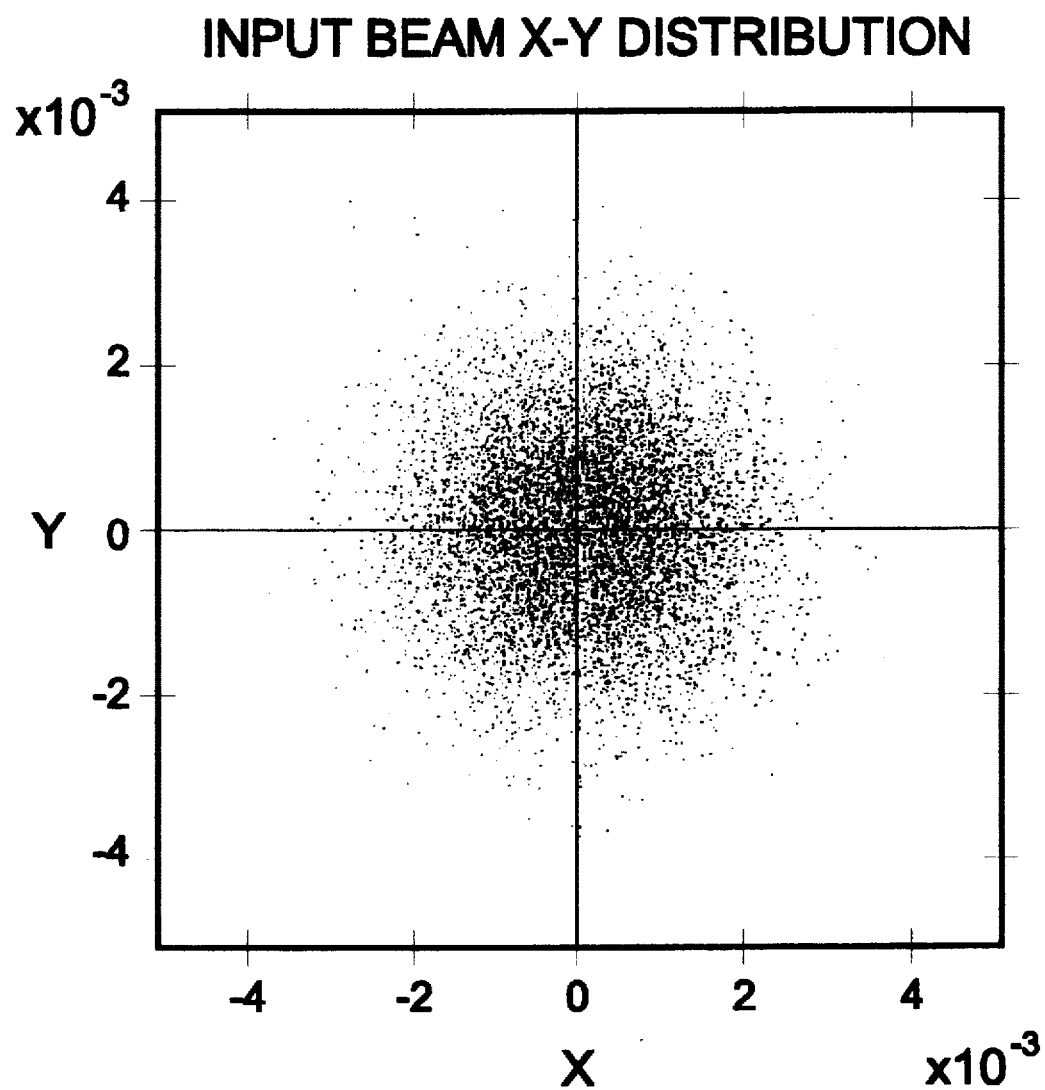
FIG. 5 is a plot of a Gaussian input beam x-y distribution as input to the non-linear optics section.
Figure 6:
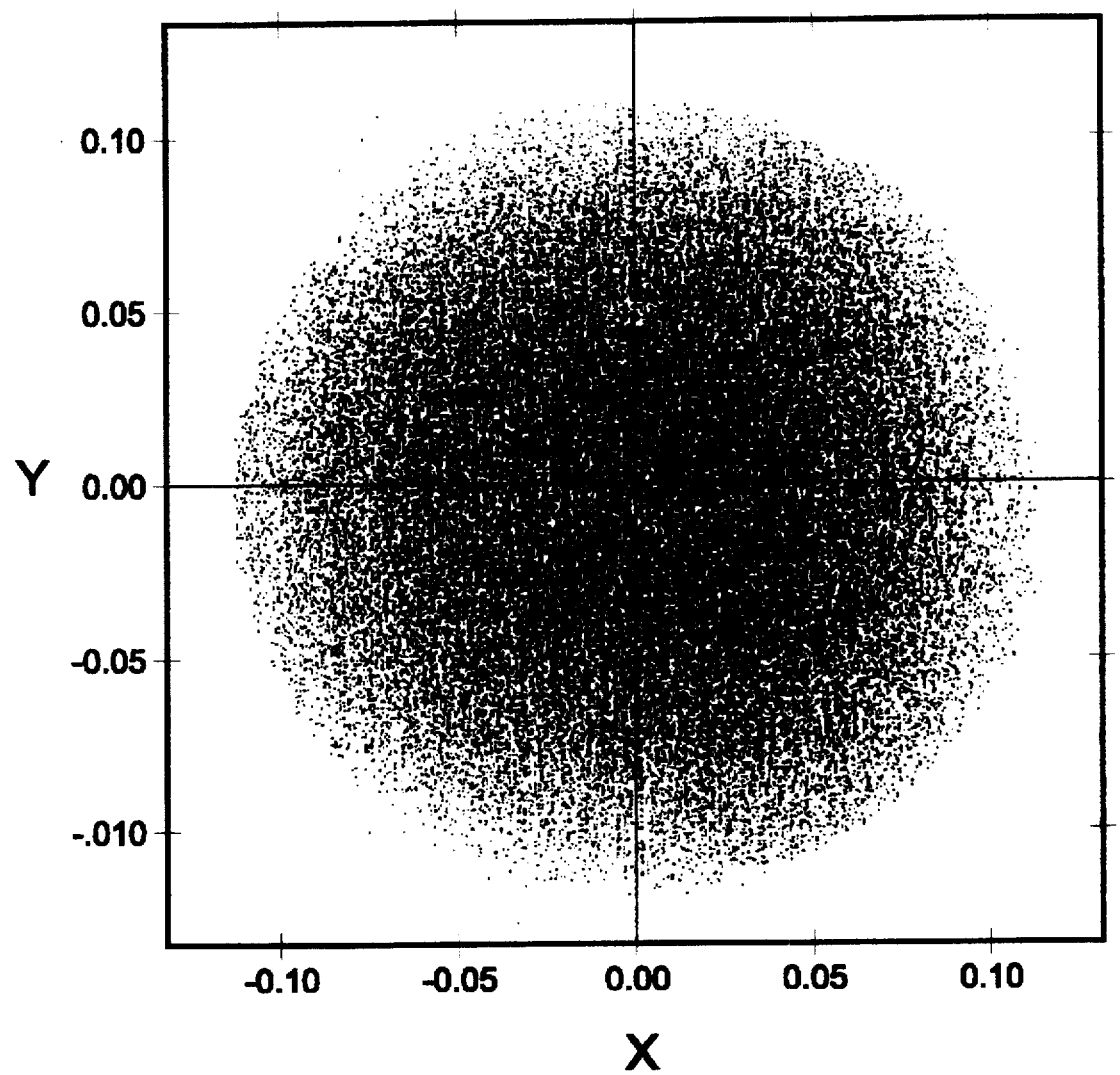
FIG. 6 is a plot of the output beam x-y distribution after a Gaussian input beam was processed by a non-linear optics section having two sextupoles.
Figure 7:
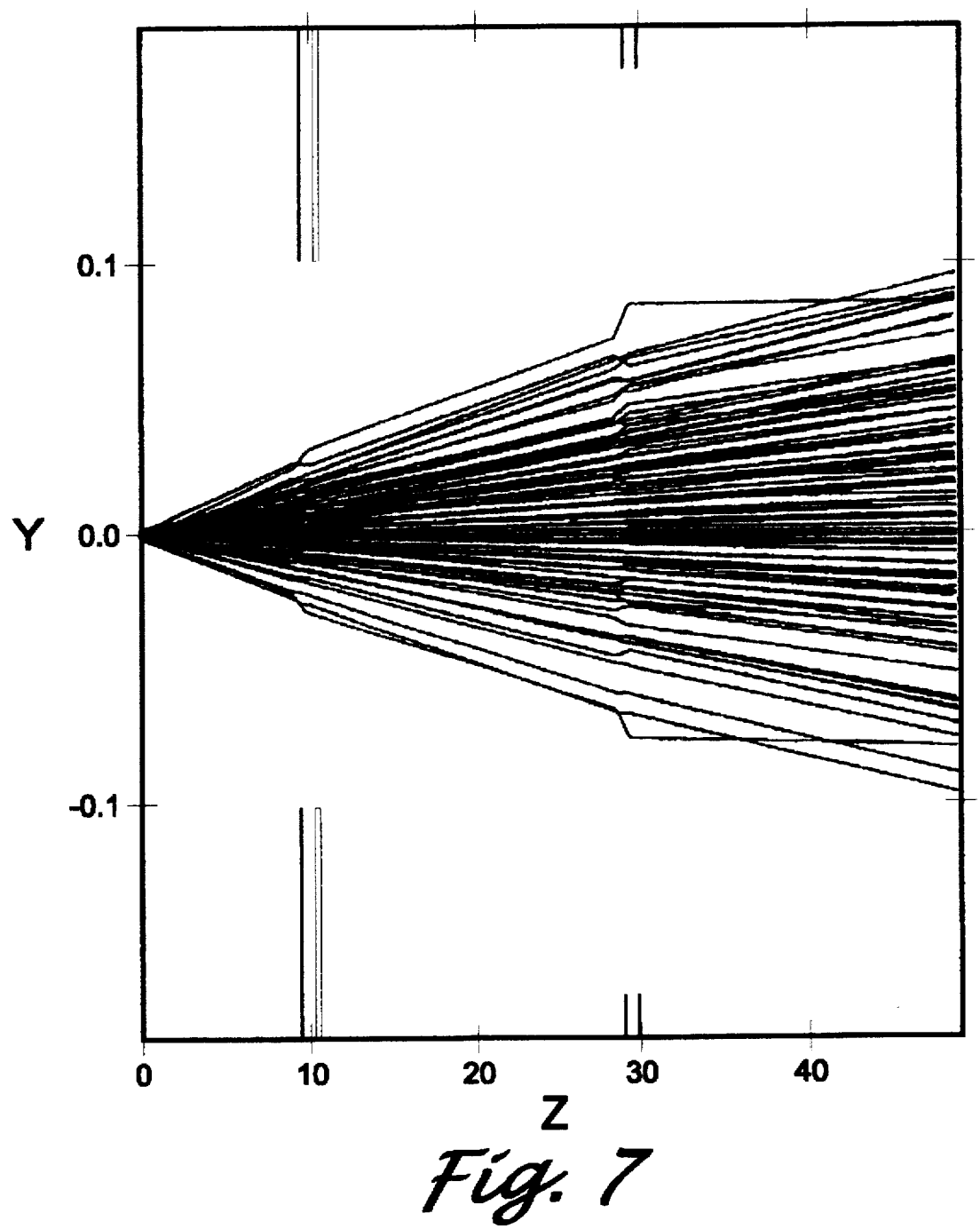
FIG. 7 is a projection of the charged particle trajectories along the x-z plane for a non-linear optics section having two sextupoles using a Gaussian input beam.
Figure 8:
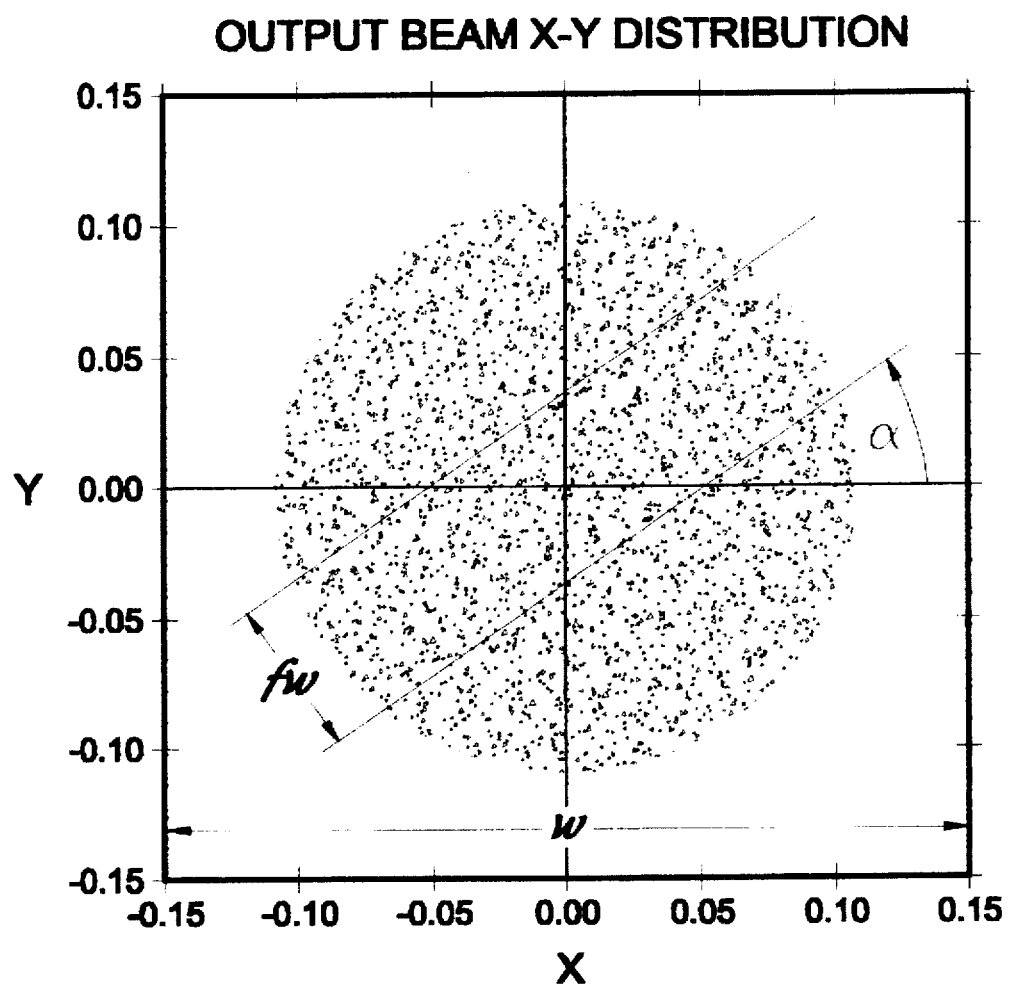
FIG. 8 is a plot of the output beam x-y distribution also showing how the slices for FIGS. 9, 13, 14, 18, 22, 25, and 27 are taken.
Figure 9:
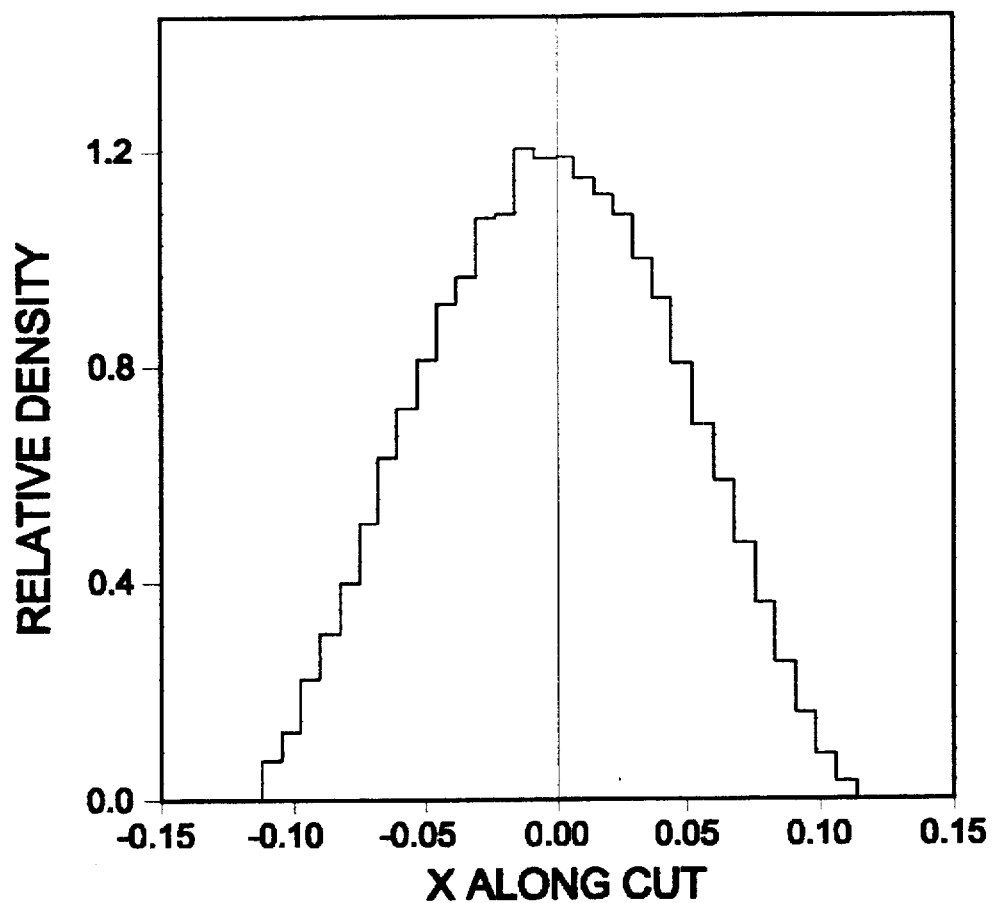
FIG. 9 is a graph of the relative particle flux density taken along the x axis of FIG. 6.
Figure 10:
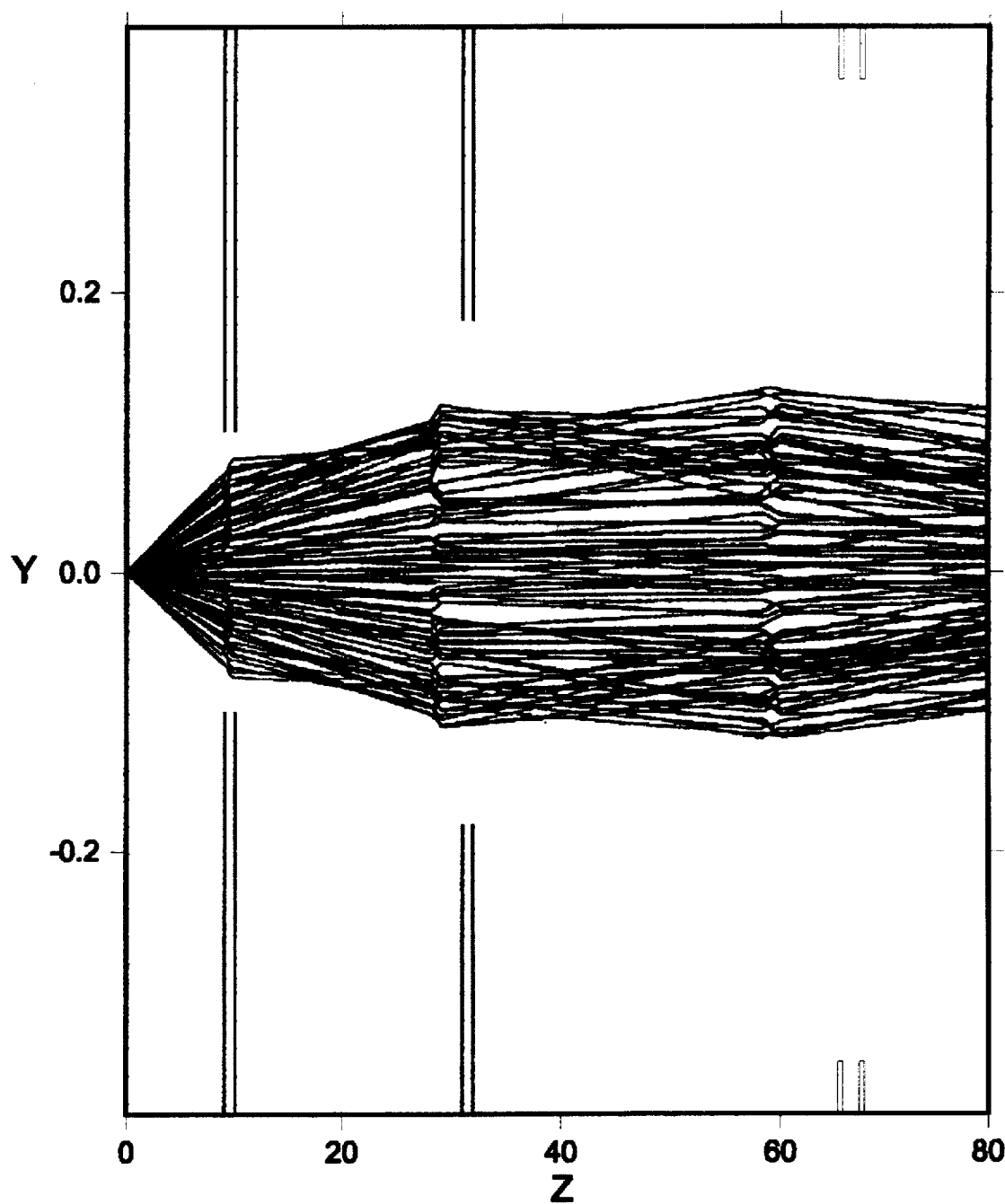
FIG. 10 is a plot showing the projection of the particle beam trajectories on the y-z plane for a non-linear optics section having three stages of sextupole doublets, the input beam being flat in x'-y' space.
Figure 11:
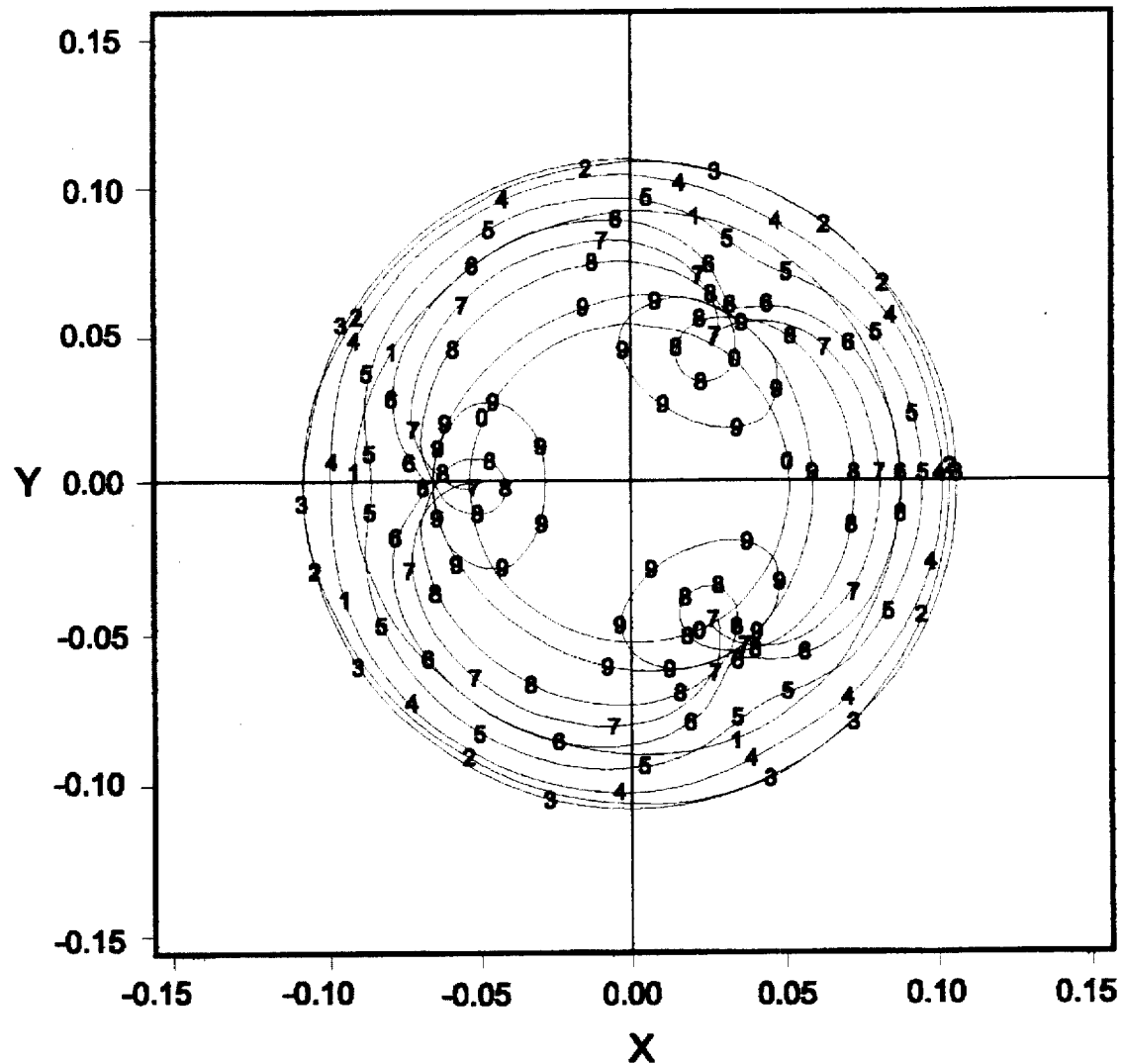
FIG. 11 is a plot of the input circles in the x-y plane after passing through the non-linear section of FIG. 10.
Figure 12:
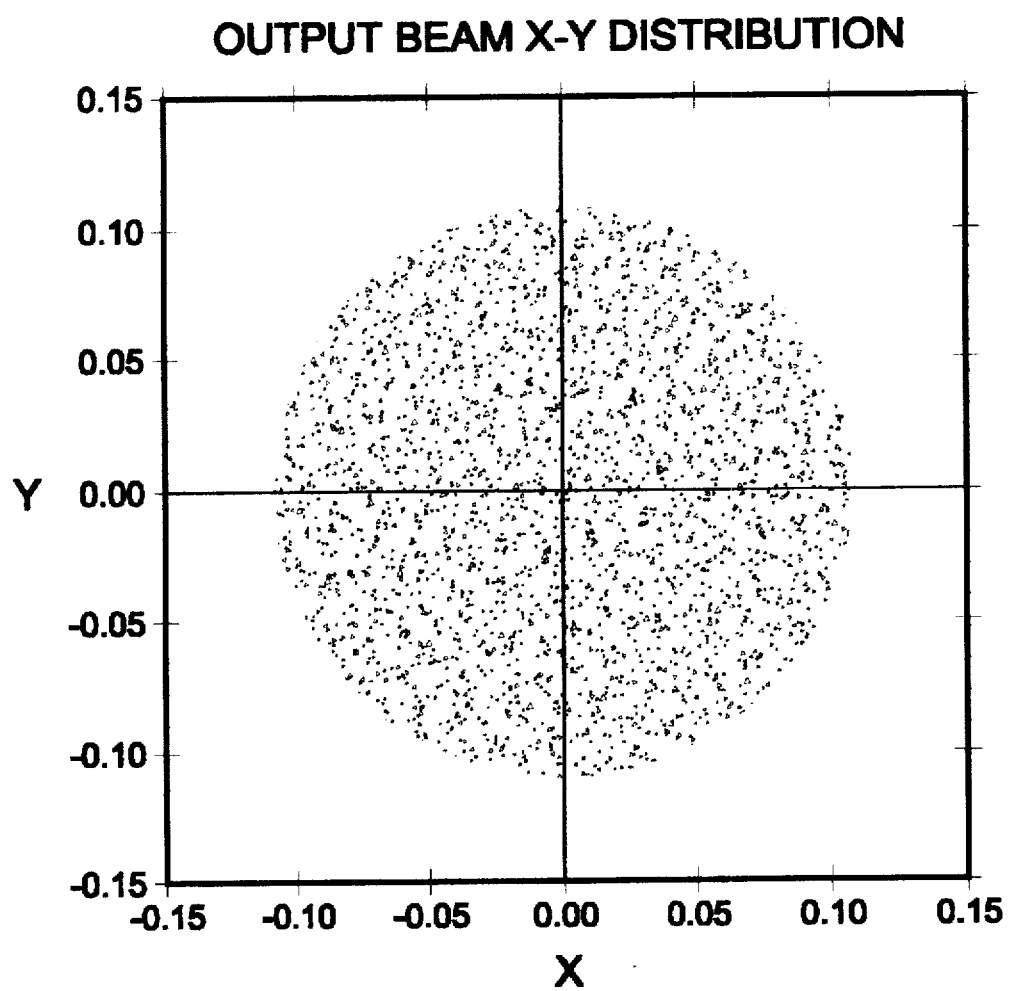
FIG. 12 is a plot of the x-y output beam distribution with a Gaussian input beam.
Figure 13:
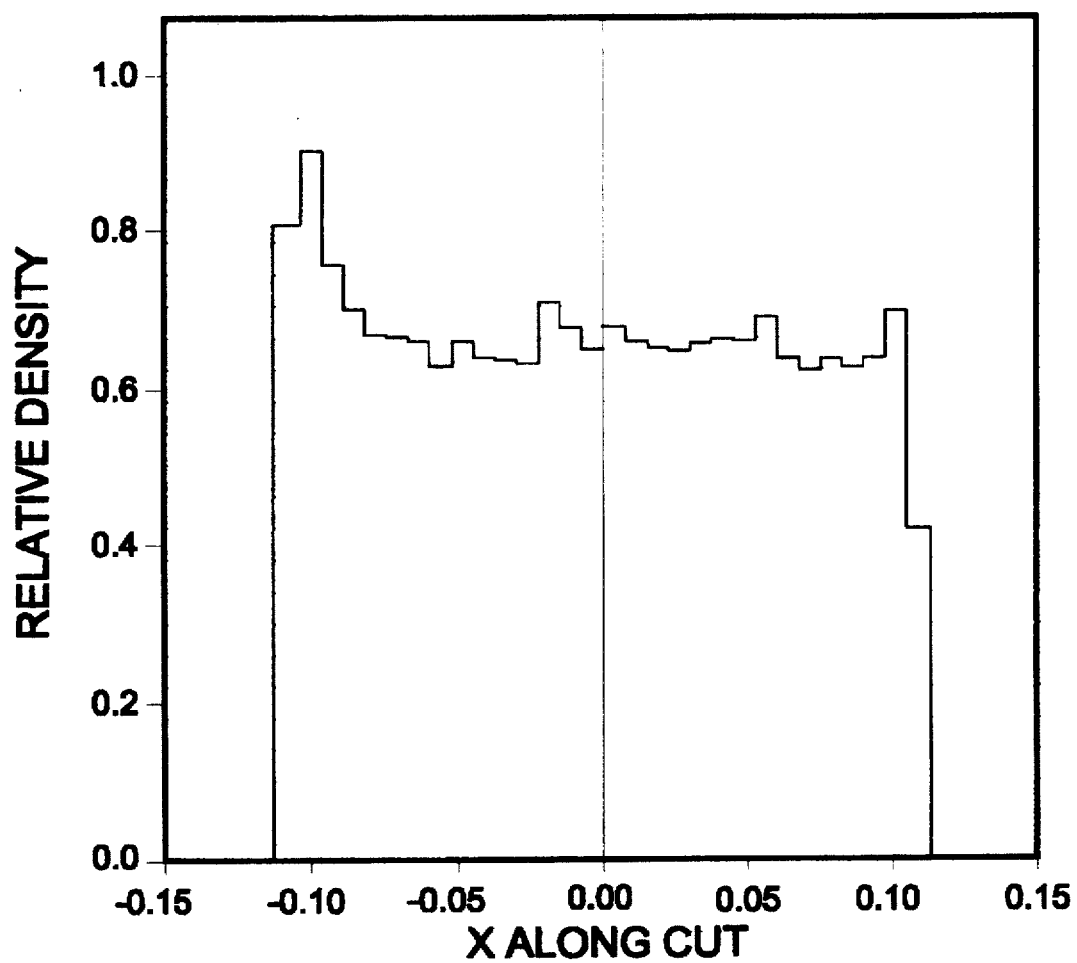
FIG. 13 is a graph of the relative particle-flux density taken along the x axis of FIG. 12.
Figure 14:
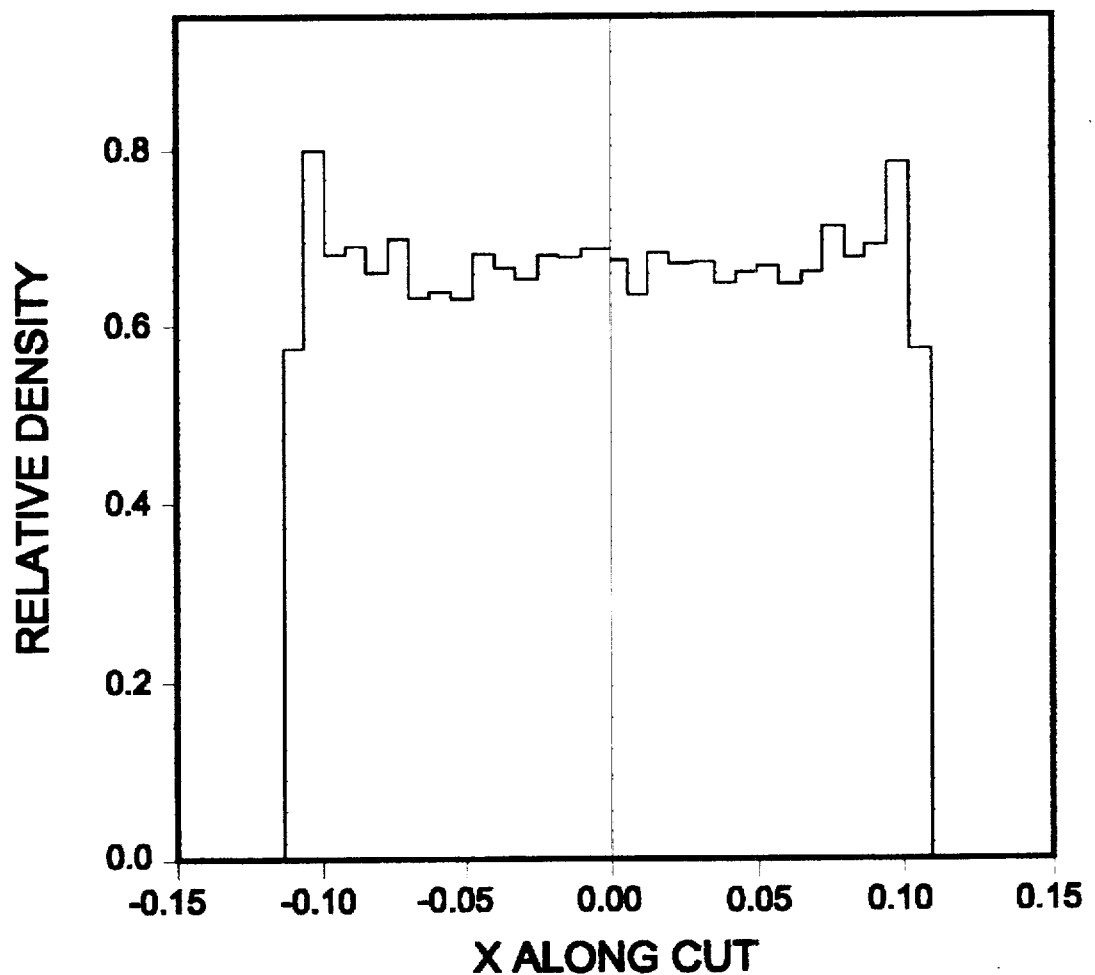
FIG. 14 is a graph of the relative particle-flux density taken along a slice with an axis inclined at 30° to the x axis of FIG. 12.
Figure 15:
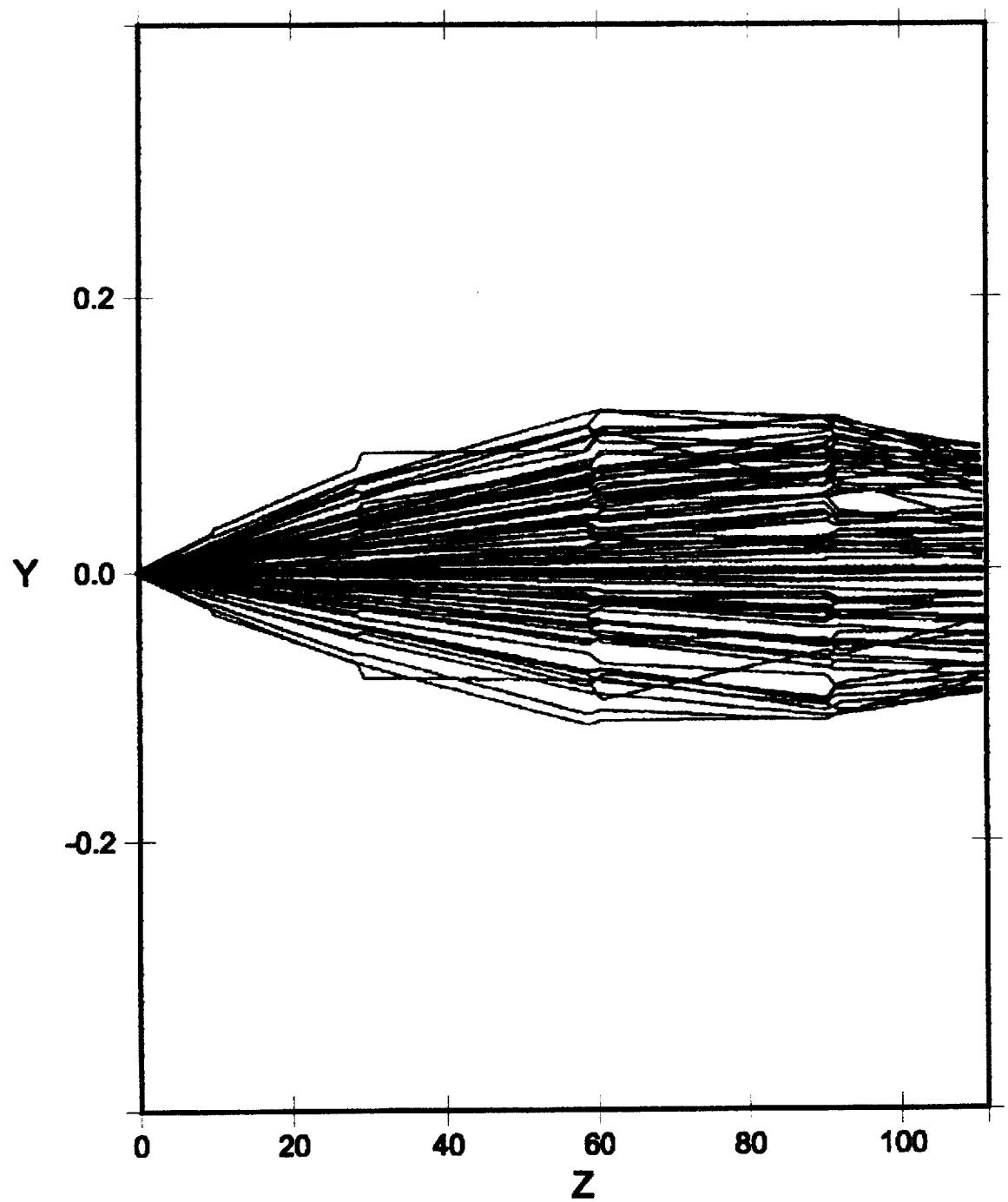
FIG. 15 is a plot showing the projection of the particle beam trajectories on the y-z plane with four sextupole doublets and a Gaussian input beam.
Figure 16:
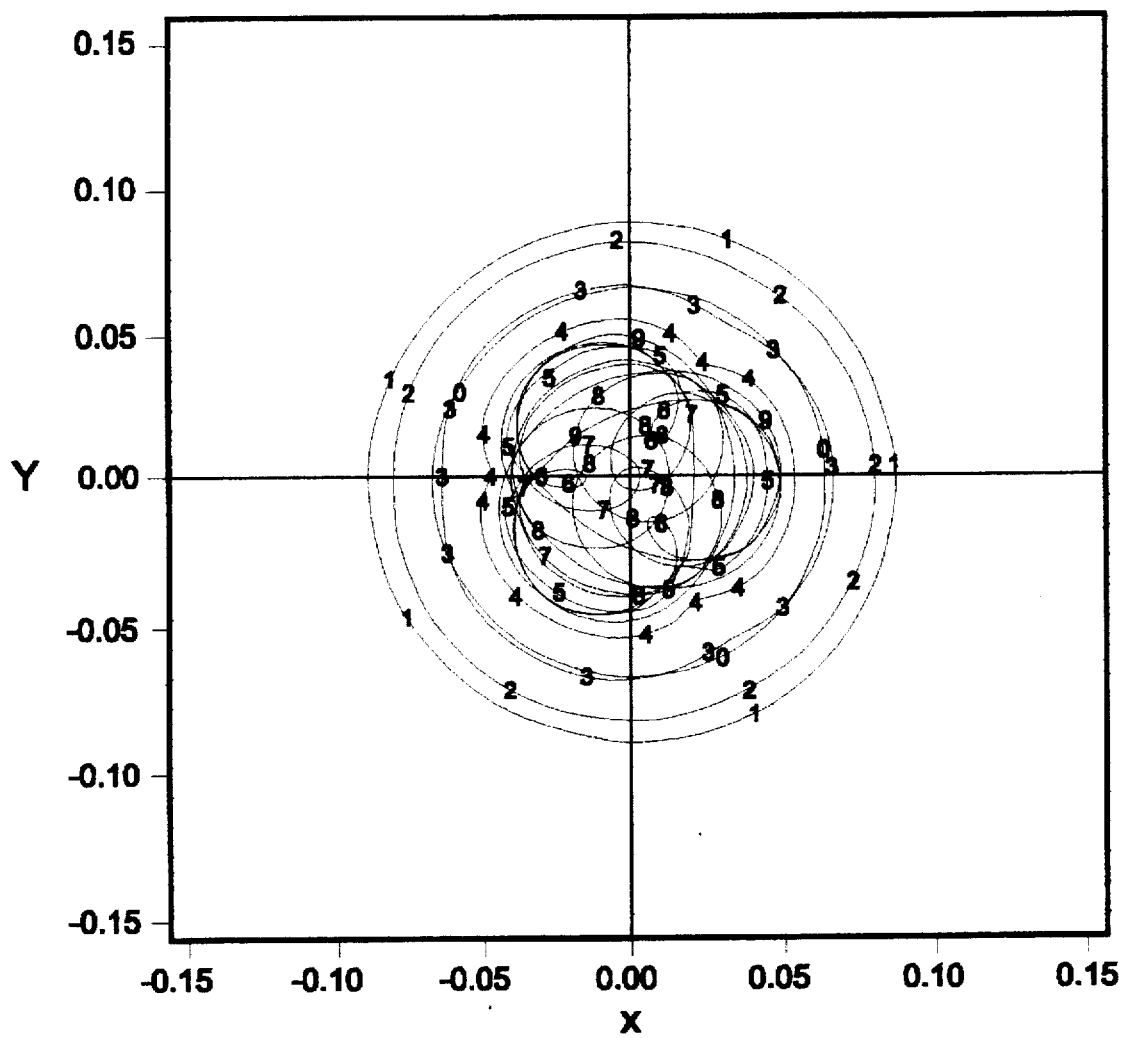
FIG. 16 is a plot of the images of the input circles in the x-y plane after passing through the four stages of sextupole doublets of FIG. 15.
Figure 17:
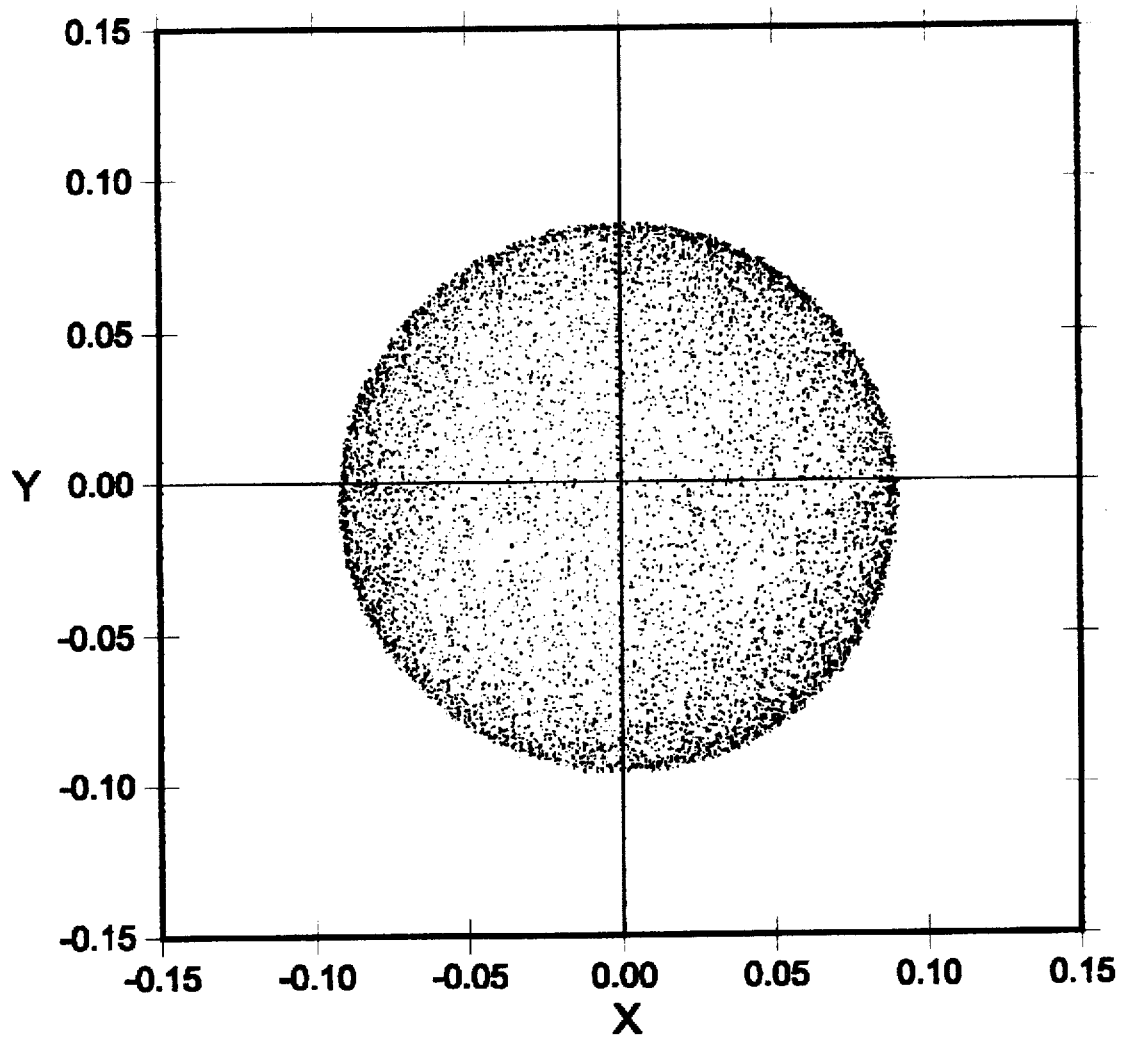
FIG. 17 is a plot of the output beam x-y distribution after passing through the 4 sextupole doublets of FIG. 15.
Figure 18:
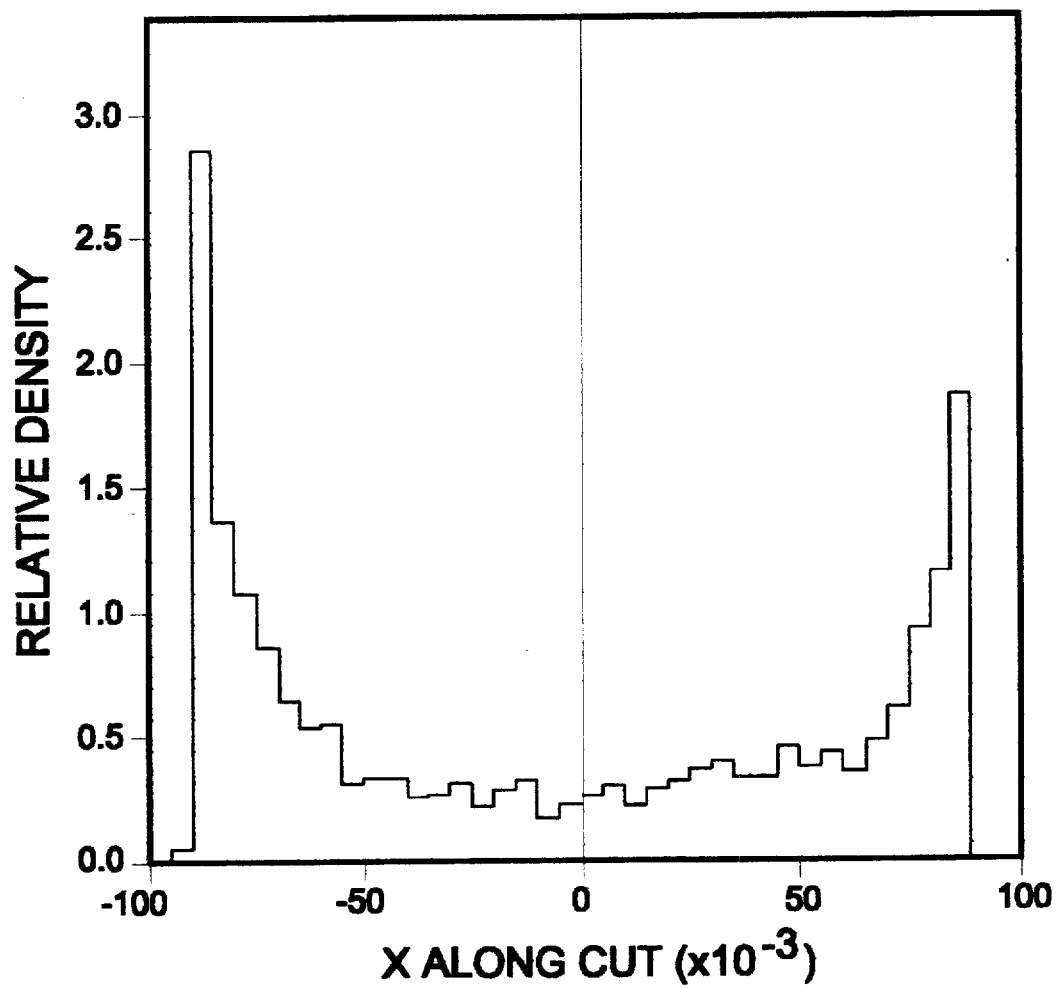
FIG. 18 is a graph of the relative particle-flux density taken along the x axis of FIG. 17.
Figure 19:
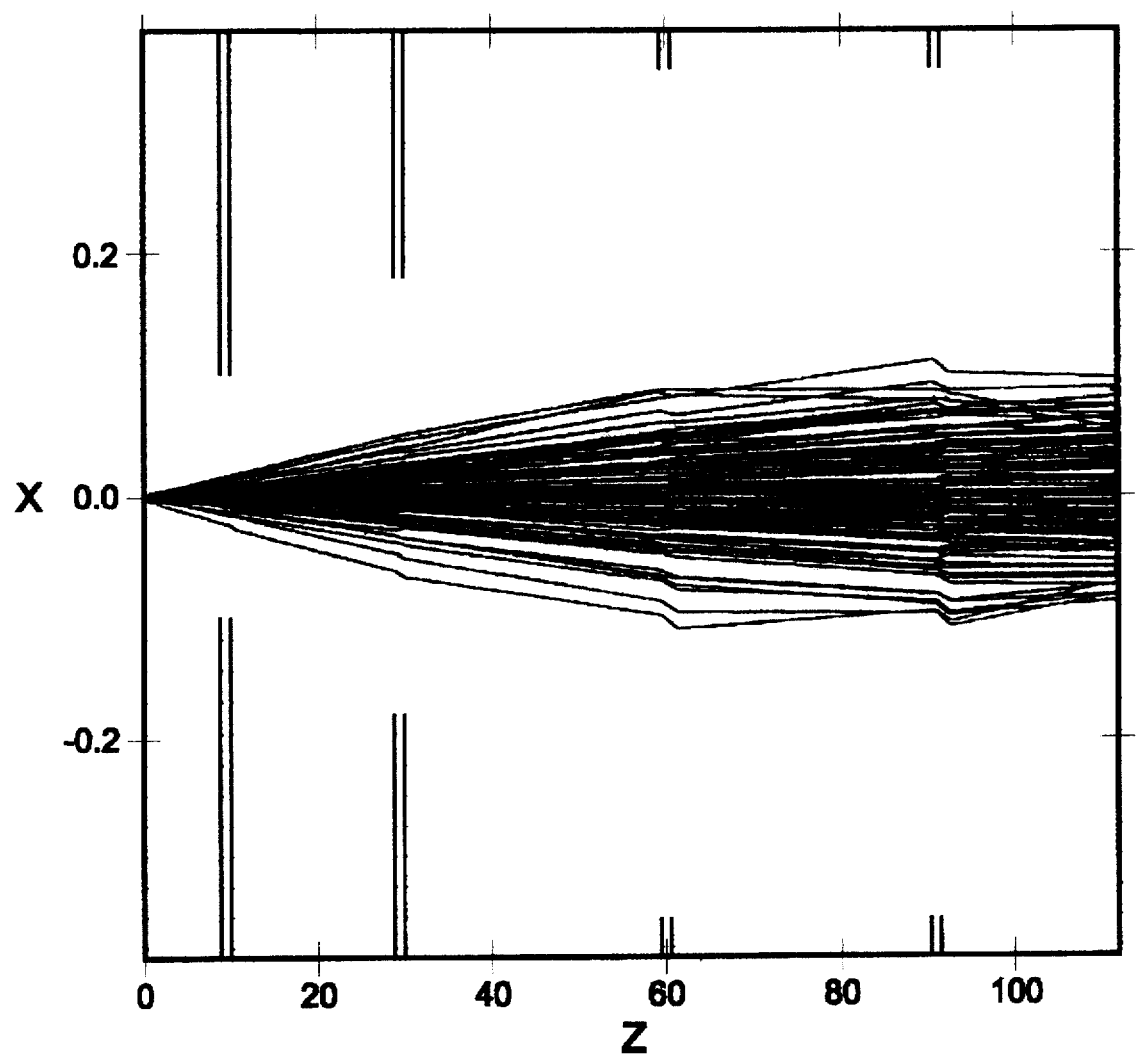
FIG. 19 is a projection of the charged particle trajectories along the x-z plane for four stages of sextupoles, having a Gaussian beam input which is linearly transformed from that of FIG. 15, so as to have a smaller angular spread, but a larger input size.
Figure 20:
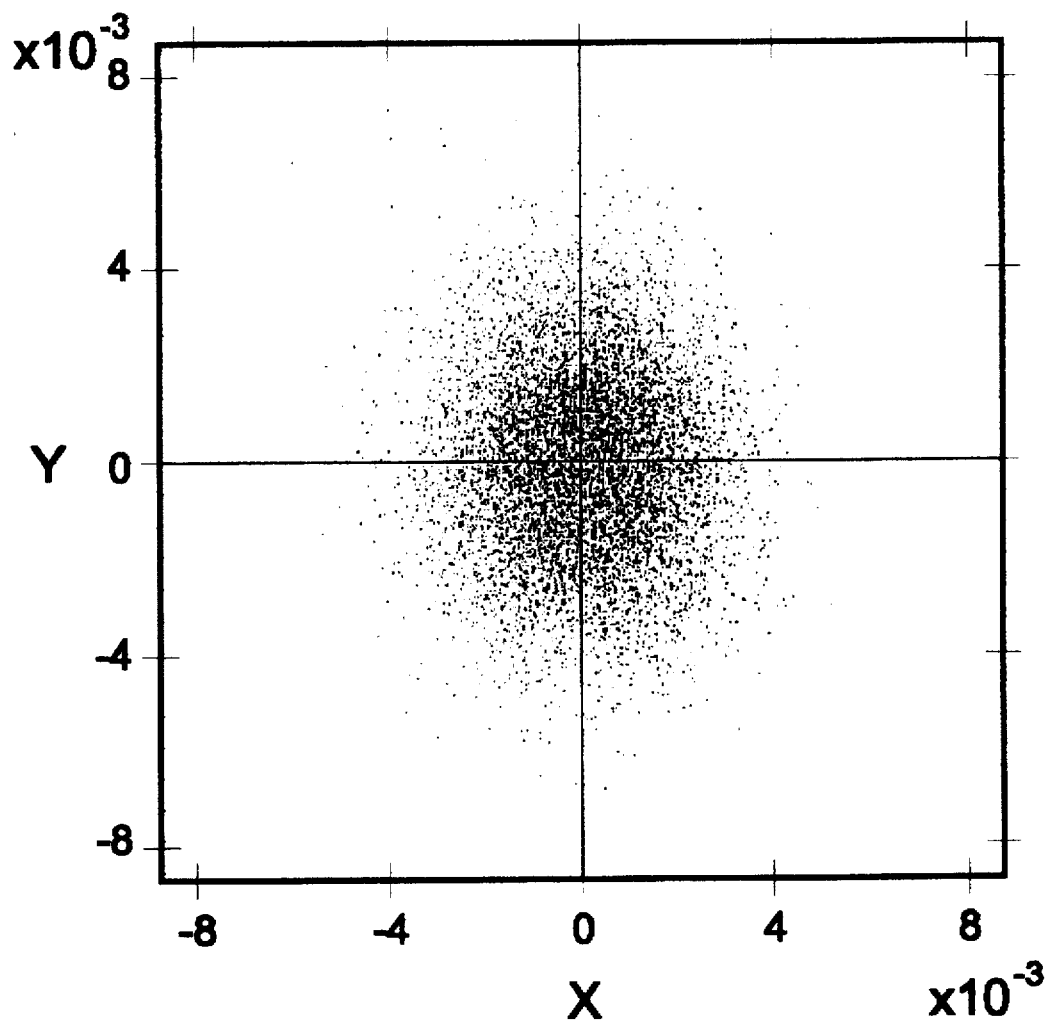
FIG. 20 is a plot of the input beam x-y distribution of the particle beam with linear optics taken in the phase-space distribution of FIG. 5 and magnified in the x and y by a factor of two and reduced in the x' and y' by a factor of 2.
Figure 21:
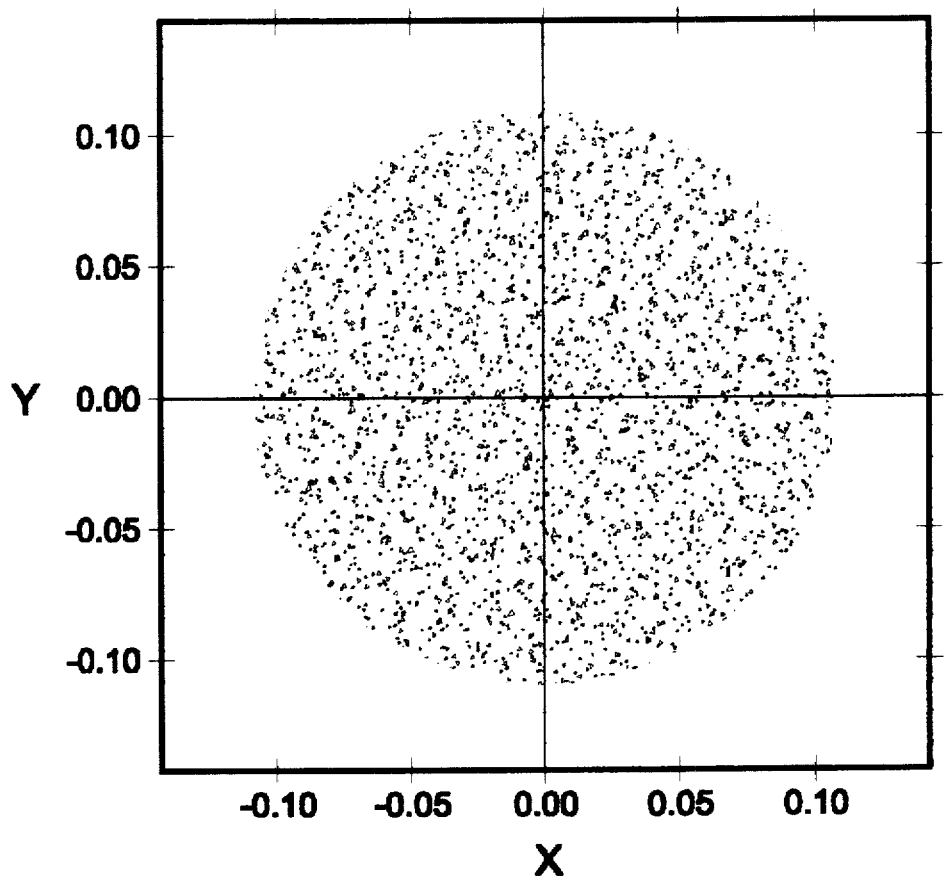
FIG. 21 is a plot of the output beam x-y distribution for a linearly transformed beam which has been passed through the optics of FIG. 19.
Figure 22:
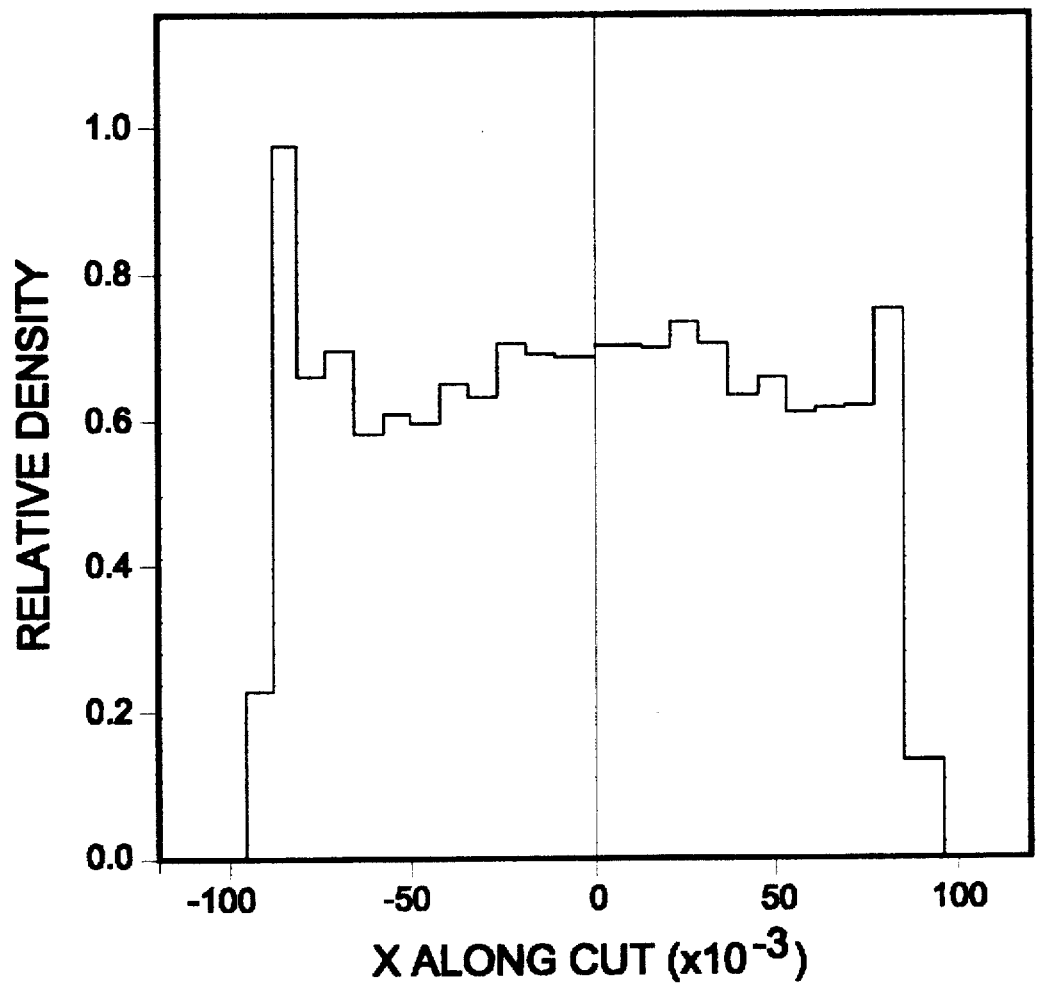
FIG. 22 is a graph of the relative particle-flux density taken along the x axis of FIG. 21.
Figure 23:
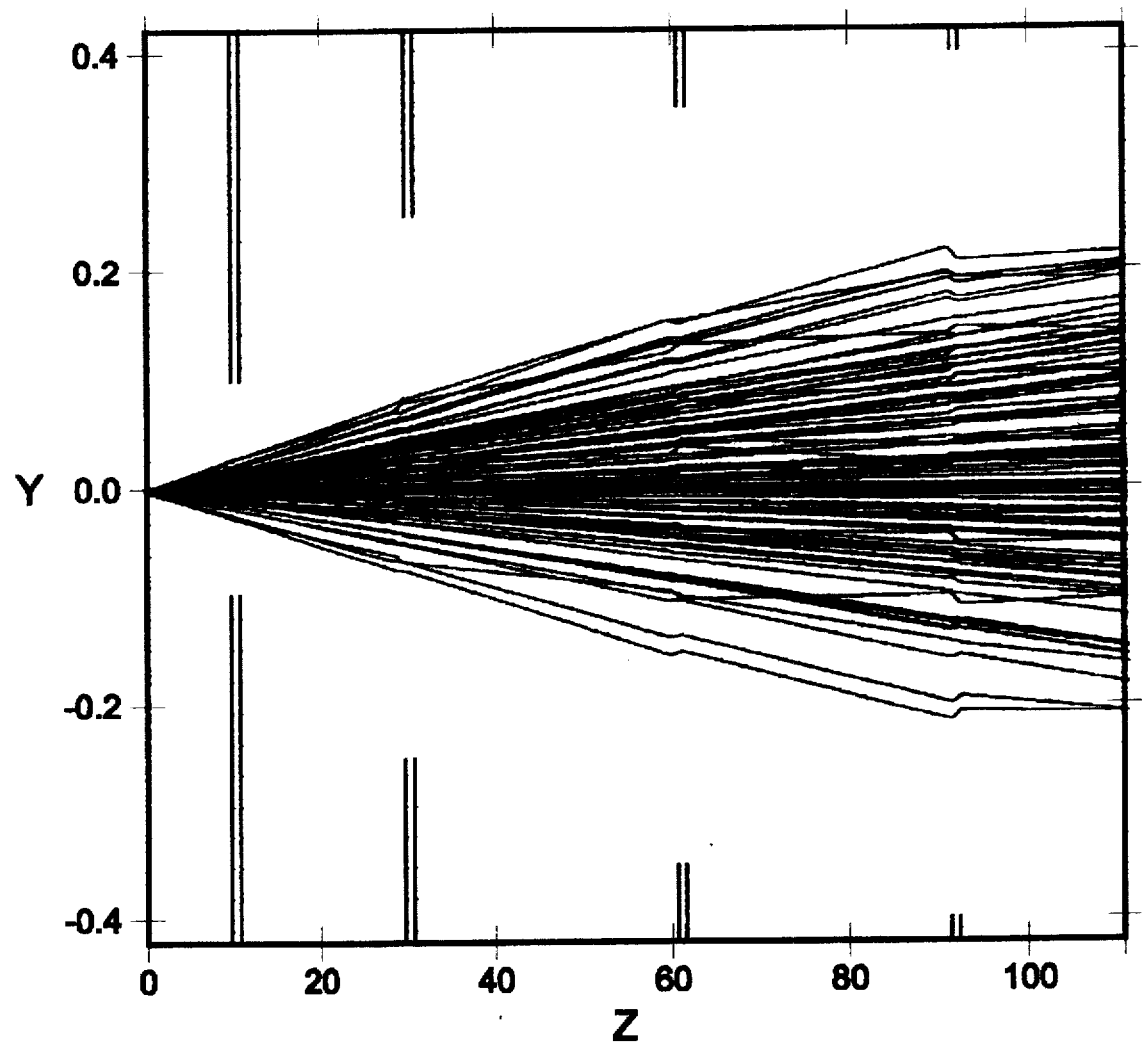
FIG. 23 is a plot showing the projection of trajectories of a Gaussian input beam on the y-z plane for an expander with four octupole doublets.
Figure 24:
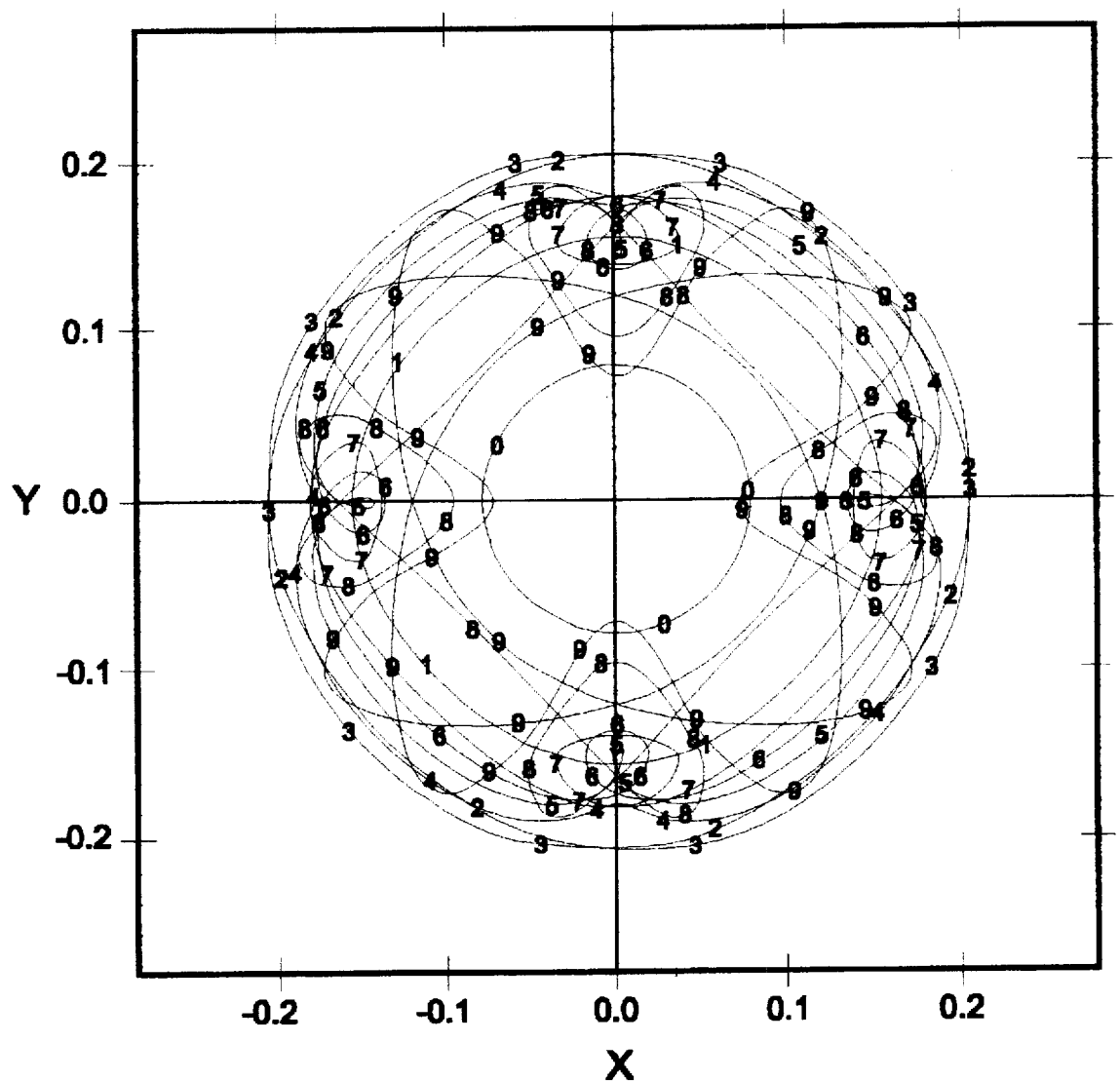
FIG. 24 is a plot of the images of the input circles in the x-y plane after passing through the non-linear optics section of FIG. 23.
Figure 25:
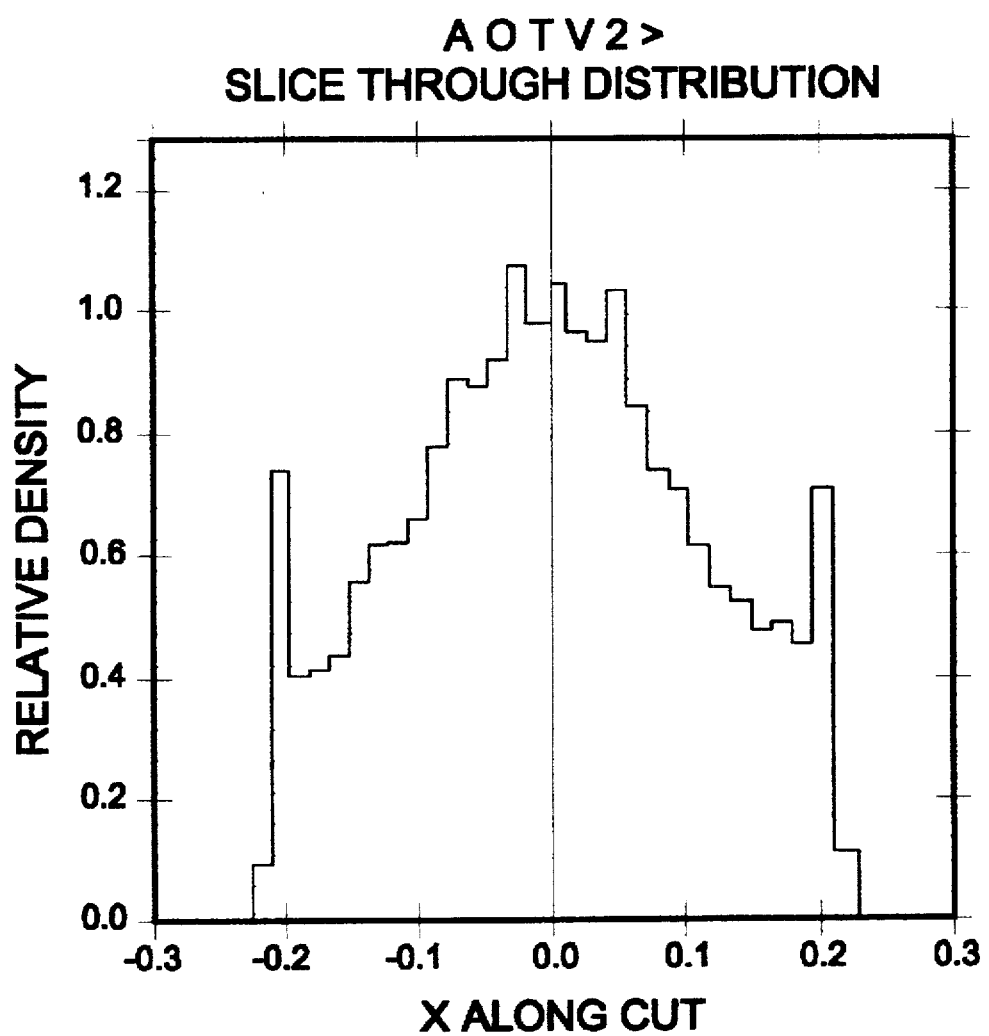
FIG. 25 is a graph of the relative particle-flux density taken along the x axis after an initially Gaussian beam has passed through the non-linear optics section of FIG. 23.
Figure 26:
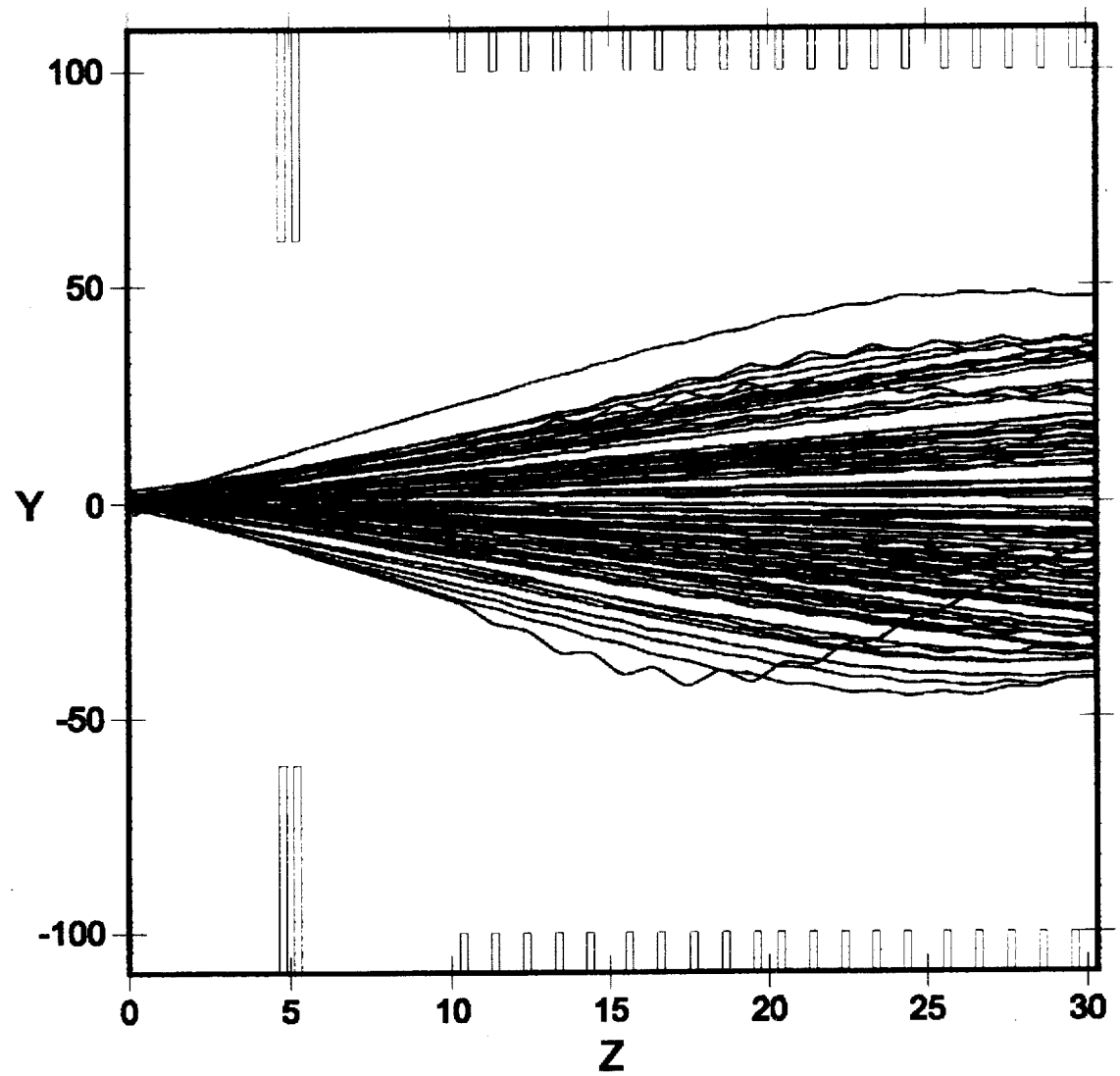
FIG. 26 is a plot showing the projection of the particle beam trajectories on the y-z plane for a single sextupole doublet and a plurality of octupole doublets.
Figure 27:
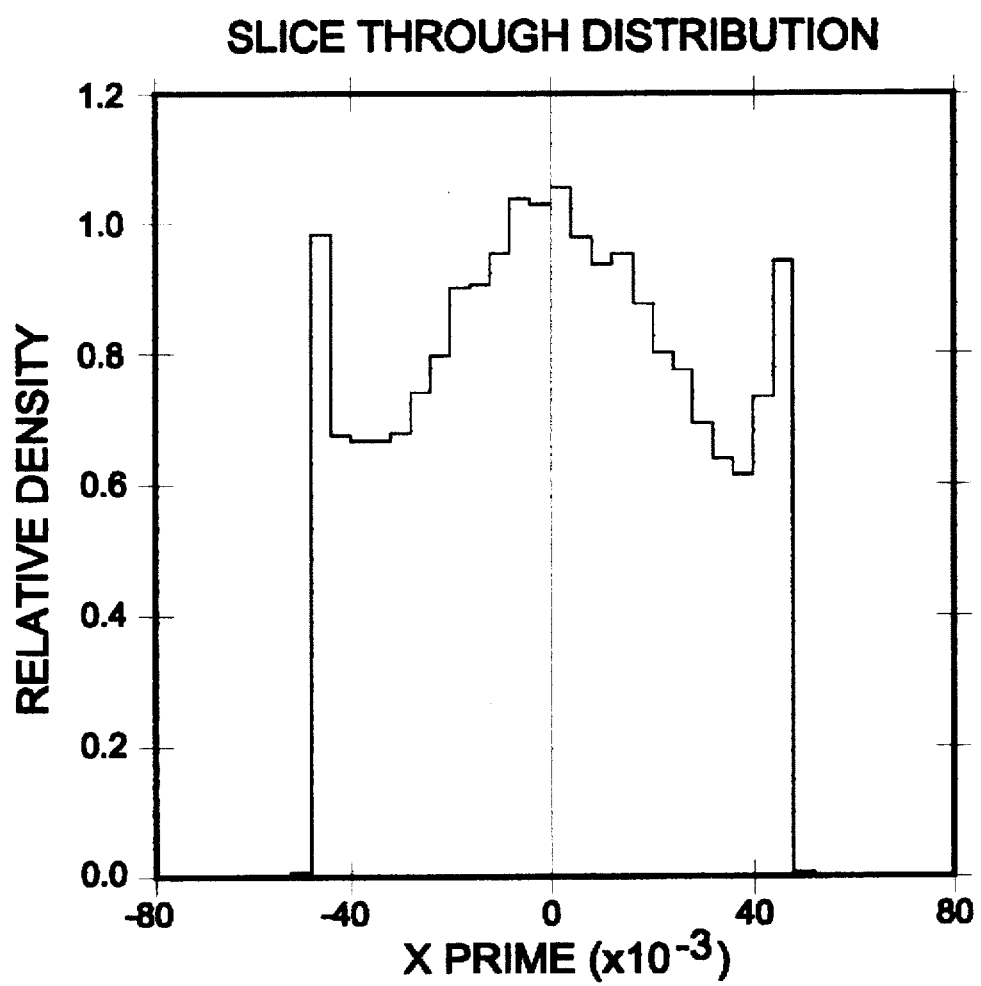
FIG. 27 is a graph of the relative particle-flux density taken along the x axis after an initially Gaussian beam has passed through the non-linear optic section of FIG. 26.
Figure 28:
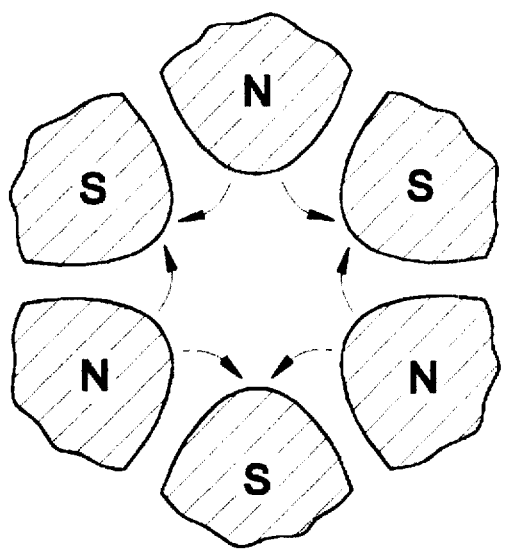
FIG. 28 is a schematic representation of the first sextupole magnet showing the magnetic flux lines thereof.
Figure 29:
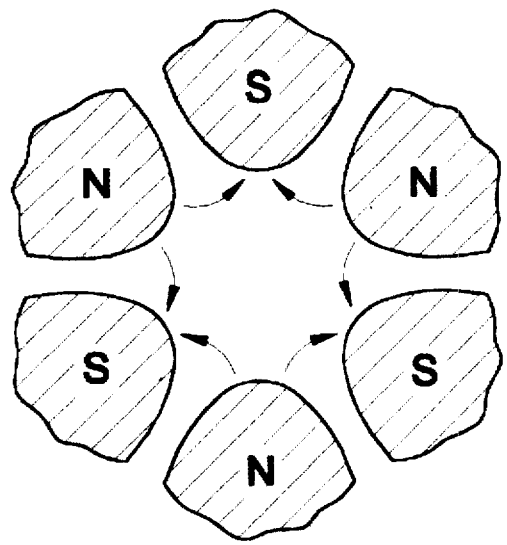
FIG. 29 is a schematic representation of the second sextupole magnet which is of opposite polarity to the first sextupole magnet, also showing the magnetic flux lines thereof.

The charged particle beam expander of the present invention is shown schematically in FIG. 1, 28, and 29 of the drawings. FIGS. 2–27 are plots showing the predicted performance of the present invention according to a computer simulation.

Referring now to FIG. 1, the charged particle beam expander 10 of the present invention is disposed intermediate a particle accelerator 8 and a target 20 and is configured to expand the charged particle beam output from the particle accelerator 8 to a desired diameter compatible with the target 20, while also providing a charged particle beam having a generally circular cross-section and also having a generally uniform particle-flux density.

Although described herein as having a specific application in the use of a particle accelerator, a proton linac, such is by way of example only, not by way of limitation. Thus, as those skilled in the art will appreciate, the present invention may be utilized with various different types of charged particle accelerators.

The charged particle beam expander 10 generally comprises first linear optic section 12, a non-linear optic section 14, and second linear optic section 16.

The first linear optic section 12 preferably comprises a plurality of quadrupole magnets 22, preferably four thereof. The quadrupole magnets 22 of the first linear optic section 12 are configured to form the charged particle beam 34 output from the particle accelerator 8 so as to have a generally circular cross-sectional area and an angular distribution that is appropriate for the following non-linear section 14. As those skilled in the art will appreciate, the exact configuration of the quadrupole magnets 22 will therefore depend upon the specific phase-space distribution of the charged particle beam 34 provided by the particle accelerator 8. The quadrupole magnets 22 and drifts of the first linear optic section 12 are thus configured to change the phase-space distribution of the charged particle beam 34 from a generally elliptical, or other cross-sectional shape to a generally circular cross-sectional area for input to the non-linear optics section 14.

The non-linear optics section 14 receives the charged particle beam 34 from the first linear optic section 12 and folds or redistributes charged particles from the fringes or periphery of the charged particle beam 34 toward the core thereof, i.e., proximate the longitudinal axis 35 thereof, so as to provide a more generally uniform cross-sectional energy distribution of the charged particle beam 34.

The non-linear optics section 14 preferably comprises a plurality of magnetic doublets 23–25 for effecting such redistribution of the charged particles. Each magnetic doublet 23–25 preferably comprises either a pair of sextupole magnets or a pair of octupole magnets. Those skilled in the art will appreciate that magnetic doublets 23–25 comprising magnets having greater than eight poles are also suitable for the practice of the present invention. According to the present invention, one, two, three or four such magnetic doublets 23–25 are utilized in the non-linear optics section 14.

The two magnets of a doublet in the present invention must be of the same multipolarity (comprise two sextupoles, or comprise two octupoles, etc.), have the same pole rotation angle, and be of nearly the same integral strength, but of opposite polarity. In passing through the first magnet of a doublet, a given particle acquires a transverse impulse that causes its trajectory to deviate from the straight-line extension of its trajectory in the field-free space before the first magnet of the doublet. The direction of the impulse is dependent upon the location of the particle with respect to the poles of the first magnet and in general can have either a radially inward or outward and azimuthal components. After leaving the first magnet, the particle passes through a relatively short field-free region (sometimes called a drift) and enters the second magnet of the doublet. Due to the deviation in the trajectory caused by the impulse given by the first magnet, the particle trajectory is offset when it passes through the second magnet of the doublet, and the impulse given to the particle by the second magnet does not exactly cancel the impulse given by the first magnet, as would be the case if there were zero drift space between the magnets and if they were also of negligible length. In spite of the fact that the impulses from the two magnets, considered separately, are not individually directed inward, the net impulse produced by the two magnets in combination with the drift between them is directed radially inward and is nearly independent of azimuthal angle, but varies strongly with radius, being negligible for particles near the axis and stronger for particles near the periphery of the beam. The radial variation of the net impulse from the doublet is stronger than linear and varies as the cube of the radius when the two magnets are sextupoles and as the fifth power when the two magnets are octupoles. (It may be desirable in some applications to vary the overall rotation angle of a pair, while still keeping the relative pole-piece rotation angle the same with a pair) When staged doublets are used in combination with drifts, particles in concentric rings in the initial angular distribution are progressively folded back to the center of the beam as the beam passes through successive non-linear doublets and drifts. The degree of inward folding can be controlled by varying the number of non-linear doublet stages and the drifts between them, by choice of sextupole or octupole doublets in particular locations, and by varying the initial angular spread of the beam by use of the initial linear optics section 12.

According to the preferred embodiment of the present invention, the bore diameters of the magnetic doublets 23–25 are progressively increased as the particles travel along the charged particle beam 34, so as to accommodate divergence of the charged particle beam 34. Magnetic doublet 24 has a larger bore than magnetic doublet 23 and magnetic doublet 25 has a larger bore than magnetic doublet 24. Thus, the non-linear optics section 14 is preferably configured so as to facilitate some expansion of the charged particle beam 34, prior to the charged particle beam 34 entering the second linear optic section 16.

The second linear optic section 16 preferably comprises a plurality of quadrupole magnets 32, preferably four thereof. The second linear optic section 16 is configured to form, at the target, a point-to-point image of the beam cross-section at the end of section 14, and adjust the diameter of the charged particle beam 34 so as to be compatible with the target 20.

Thus, the charged particle beam expander of the present invention may be utilized to expand the charged particle beam to a much larger diameter in order to reduce the power density at the target. Such expansion of the charged particle beam 34 thus eliminates the need to perform undesirable rastering thereof.

Additionally, a more uniform energy density of the charged particle beam 34 is provided, so as to prevent the formation of "hot spots" and so as to facilitate greater control of the energy delivered therewith. Thus, according to the present invention, the circular cross-section of the charged particle beam 34 is enhanced and maintained, so as to facilitate use in applications wherein such a circular cross-section is desired.

The use of conventional sextupoles and octupoles makes the present invention substantially less sensitive to alignment and positioning deviations. According to the present invention, the output beam energy distribution is less sensitive to the input beam distribution.

Either DC electromagnets or permanent magnets or a combination thereof may be used for all of the magnetic elements of the present invention.

Bends may be utilized either prior to or following the charged particle beam expander of the present invention, so as to route the charged particle beam to the target.

For low energy applications, electrostatic elements may be used instead of magnets for higher energy applications, such as for proton accelerators providing a charged particle beam having an energy greater than 1 MeV, magnetic elements are preferred.

The number of magnetic doublets 24 in the non-linear optics section 14 can vary from a single magnetic doublet 24 to as many as 100 magnetic doublets 24.

Thus, according to the present invention, the small-diameter, high power-density charged particle beam output from a particle accelerator is expanded before being incident upon a target in order to avoid undesirable excessive local heating of the target, potentially resulting in damage thereto or overirradiation thereof.

The charged particle beam from a particle accelerator typically has an approximately Gaussian phase space distribution, i.e., in the x-y and x'-y' dimensions. This means that there are some charged particles present in the tails of the distribution, i.e., the periphery of the beam. Linear magnetic optics systems are capable of magnifying or expanding the charged particle beam. It is generally desirable to fold or redistribute the charged particles from the beam's periphery back into the core thereof, so as to avoid radioactivation, radiation damage, undesirable heating, etc. of beam line and other nearby components and also so as to flatten the intensity profile at the target. The charged particle beam expander of the present invention provides a generally circular beam spot at the target wherein the tails or peripheral portion of the beam has been folded or redistributed back into the core thereof, so as to enhance the uniformity of the charged particle beam. According to the present invention, there are substantially no charged particles present outside of a certain radius of the charged particle beam.

The charged particle beam expander of the present invention may be utilized in either pulse or steady state neutron sources.

As those skilled in the art will appreciate, the sextupole doublets provide a radially inward impulse which varies approximately with $R^3$ and the octupole doublets provide an impulse which varies approximately with $R^5$. Thus, octupole doublets affect the core of the beam less than sextupole doublets. By way of contrast, a quadrupole doublet provides an impulse which is approximately linear with radius.

The multistage expansion of the present invention provides a high degree of redistribution of the charged particles from the periphery of the beam to the core thereof.

Clearance between the beam and the magnetic pole pieces may be increased by adding doublet/drift stages and decreasing the angular spread (while simultaneously increasing the spatial size) of the beam with the first linear optics section 12. With the smaller angular size, a charged particle beam that would otherwise be overfolded with a larger angular size is given a substantially flat energy distribution. The first linear optic section 12 may therefore be utilized for the compensation of slow variations in beam size.

The second linear optic section 16 utilizes a point-to-point focusing system, preferably four quadrupole magnets 32, as discussed above, to image the charged particle beam 34 therefrom onto the target 20 with the desired magnification.

Effective charged particle beam emittance is increased in the expansion, mostly via an increase in the x-y cross-section thereof. Angle spread is relatively unaffected.

In each of the computer simulations, the field strengths, magnet sizes, etc. were those which are easily achievable with established room-temperature iron-pole-piece contemporary magnetic technology. The simulations were performed for protons with a rigidity of 5 T-m, but it is anticipated that the results can easily be scaled to different energies and particle types. Typical beam emittances, e.g., 1 π-mm-mR unnormalized emittance, were used in each of the simulations.

It is anticipated that one or more quadrupoles may be utilized in the non-linear optics section 14 in order to provide further adjustment to the profile, i.e., so as to obtain a more circular cross-sectional configuration of the charged particle beam 34.

Referring now to FIG. 28, the first sextupole magnet, i.e., the first magnet of a doublet, is shown. The first sextupole magnet comprises three north magnetic poles and three south magnetic poles arranged in an alternating configuration so as to form magnetic flux lines intermediate the adjacent poles thereof.

Referring now to FIG. 29, the second sextupole magnet, i.e., the second magnet of the a doublet, is shown. The second sextupole magnet comprises three north magnetic poles and three south magnetic poles in a manner like that of the first sextupole magnet of FIG. 28, except that the polarity of each magnet is reversed. Further, as in the first sextupole magnet, magnetic flux lines are formed between adjacent poles.

It is understood that the exemplary charged particle beam expander described herein and shown in the drawings represents only a presently preferred embodiment of the invention. Indeed, various modifications and additions may be made to such embodiment without departing from the spirit and scope of the invention. For example, the present invention may be utilized with various different types of accelerators, e.g., linear accelerators, cyclotrons, etc. Thus, these and other modifications and additions may be obvious to those skilled in the art and may be implemented to adapt the present invention for use in a variety of different applications.

What is claimed is:

1. A charged particle beam expander for increasing a diameter of a charged particle beam while also increasing uniformity of an area energy distribution thereof, the charged particle beam expander comprising:

a) a first linear optics section receiving the charged particle beam from a particle accelerator, the first linear optics section configured to form the charged particle beam to have a generally circular cross-section;

b) a non-linear optics section receiving the charged particle beam from the first linear optics section, comprising two magnetic elements, both magnetic elements of a doublet comprising one of a sextupole and an octupole, the non-linear optics section configured to redistribute charged particles from a periphery of the charged particle beam toward a core thereof; and c) a second linear optics section receiving the charged particle beam from the non-linear optics section, the second linear optics section configured to adjust the diameter of the charged particle beam and to image the charged particle beam onto the target.

2. The charged particle beam expander as recited in claim 1, wherein the first linear optics section comprises at least four quadrupole magnets.

3. The charged particle beam expander as recited in claim 1, wherein the non-linear optics section comprises at least one drift.

4. The charged particle beam expander as recited in claim 1, wherein the non-linear optics section comprises a) at least one drift; and b) at least one quadrupole.

5. The charged particle beam expander as recited in claim 1, wherein fields of the magnets of the sextupole and octupole doublets have opposite polarities.

6. The charged particle beam expander as recited in claim 5, wherein the fields of the magnets of the sextupole and octupole doublets are approximately equal in intensity.

7. The charged particle beam expander as recited in claim 5, wherein the fields of the magnets of the sextupole and octupole doublets differ in intensity to form the charged particle beam to have a more circular cross-section.

8. The charged particle beam expander as recited in claim 1, wherein the first linear optics section, the non-linear optics section, and the second linear optics section comprise electrostatic elements.

9. The charged particle beam expander as recited in claim 1, wherein the first linear optics section, the non-linear optics section, and the second linear optics section comprise a combination of magnetic and electrostatic elements.

10. The charged particle beam expander as recited in claim 1, wherein a plurality of magnetic doublets of the non-linear optics section are configured to receive an expanding charged particle beam therethrough.

11. A method for increasing a diameter of a charged particle beam while also increasing uniformity of an area energy distribution thereof, the method comprising the steps of:

a) receiving the charged particle beam from a particle accelerator into a first linear optics section and forming the charged particle beam to have generally circular cross-section via the first linear optics section;

b) receiving the charged particle beam from the first linear optics section into a non-linear optics section and redistributing charged particles from a periphery of the charged particle beam toward a core thereof; and c) receiving the charged particle beam from the non-linear optics section comprising at least one magnetic doublet, each magnetic doublet comprising two magnetic elements, each magnetic element comprising one of a sextupole and an octupole magnet, and increasing the diameter of the charged particle beam and imaging the charged particle beam onto a target.

12. The method as recited in claim 11, wherein the step of receiving the charged particle beam into the first linear optics section comprises at least four quadrupole magnets.

13. The method as recited in claim 11, wherein the step of receiving the charged particle beam into the non-linear optics section comprises at least one drift.

14. The method as recited in claim 11, wherein the step of receiving the charged particle beam into the non-linear optics section comprises at least one quadrupole magnet.

15. The method as recited in claim 11, wherein the step of receiving the charged particle beam into the non-linear optics section comprises sextupole and octupole doublet magnets having opposite polarities.

16. The method as recited in claim 15, wherein the sextupole and octupole doublet magnets have magnetic fields of approximately equal intensity.

17. The method as recited in claim 15, wherein the sextupole and octupole doublet magnets have magnetic fields of different intensity.

18. The method as recited in claim 11, wherein the sextupole and octupole doublet magnets are configured to provide a generally axisymmetric magnetic field that extends inwardly toward the charged particle beam such that a force generated thereby is approximately zero proximate a longitudinal axis of the charged particle beam and such that the force generated thereby increases with increasing radial distance from the longitudinal axis.

* * * * *